(12) United States Patent
Pavlov et al.

(10) Patent No.: US 9,634,156 B2
(45) Date of Patent: Apr. 25, 2017

(54) SEMICONDUCTOR PHOTOMULTIPLIER AND READOUT METHOD

(71) Applicants: Nikolai Pavlov, Cork (IE); Carl Jackson, County Cork (IE); Kevin O'Neill, County Cork (IE)

(72) Inventors: Nikolai Pavlov, Cork (IE); Carl Jackson, County Cork (IE); Kevin O'Neill, County Cork (IE)

(73) Assignee: Sensl Technologies Ltd. (IE)

( * ) Notice: Subject to any disclaimer, the term of this patent is extended or adjusted under 35 U.S.C. 154(b) by 641 days.

(21) Appl. No.: 13/679,343

(22) Filed: Nov. 16, 2012

(65) Prior Publication Data

US 2013/0313414 A1 Nov. 28, 2013

Related U.S. Application Data

(60) Provisional application No. 61/651,621, filed on May 25, 2012.

(51) Int. Cl.
| | |
|---|---|
| *H01L 31/0224* | (2006.01) |
| *H01L 21/04* | (2006.01) |
| *G01J 1/44* | (2006.01) |
| *H01L 31/107* | (2006.01) |
| *H01L 27/146* | (2006.01) |

(52) U.S. Cl.
CPC ......... *H01L 31/0224* (2013.01); *G01J 1/44* (2013.01); *H01L 21/04* (2013.01); *H01L 27/14601* (2013.01); *H01L 27/14645* (2013.01); *H01L 31/022408* (2013.01); *H01L 31/107* (2013.01)

(58) Field of Classification Search
CPC ............. G01J 1/44; G01J 2001/4446; G01J 2001/4453; G01J 2001/446; G01J 2001/4466; H01L 31/107; H01L 31/0224
IPC ....................................................... G01J 1/44
See application file for complete search history.

(56) References Cited

U.S. PATENT DOCUMENTS

| | | | | |
|---|---|---|---|---|
| 2004/0169128 A1* | 9/2004 | Mizuno | ............. | G01J 1/44 250/214 R |
| 2009/0323897 A1* | 12/2009 | Kameshima | ......... | A61B 6/4233 378/116 |
| 2011/0272561 A1* | 11/2011 | Sanfilippo | ........... | H01L 27/1446 250/214.1 |
| 2013/0153975 A1* | 6/2013 | Henseler et al. | ............. | 257/290 |

* cited by examiner

*Primary Examiner* — Francis M Legasse, Jr.
*Assistant Examiner* — Don Williams
(74) *Attorney, Agent, or Firm* — Tarolli, Sundheim, Covell & Tummino LLP

(57) ABSTRACT

A silicon photomultiplier device is provided. The device comprises a plurality of photosensitive cells each having a photo-detector, a quench resistive load and a first stage capacitive load. The device is arranged in a three electrode connection configuration comprising first and second electrodes arranged to operably provide a biasing of the device and a third electrode operably used to readout a signal from the device. A second stage capacitive load is operably coupled to two or more photosensitive cells.

38 Claims, 29 Drawing Sheets

SEMICONDUCTOR PHOTOMULTIPLIER AND READOUT METHOD

RELATED APPLICATIONS

The present invention claims priority from U.S. Provisional Patent Application No. 61/651,621, filed May 25, 2012, herein incorporated by reference in its entirety.

FIELD OF THE INVENTION

The present invention relates to photon detectors. In particular, the present invention relates to fast, high sensitivity photon detectors such as semiconductor photomultipliers, and to a readout method for semiconductor photomultipliers. In particular, but not exclusively, the present invention relates to semiconductor photomultipliers (SiPMs or SPMs) in such areas as Positron Emission Tomography [PET], including Time-Of-Flight PET [TOF-PET], Laser Ranging [LIDAR] applications, bio luminescence, High Energy Physics [HEP] detectors.

BACKGROUND

SPMs are semiconductor photon sensitive devices made up of an array of very small Geiger-mode avalanche photodiode (APD) cells on a substrate such as silicon. An example 10×10 microcell array is shown in FIG. 1 of the accompanying drawings. Each cell is connected to one another to form one larger device with one signal output. The entire device size can be as small as 1×1 mm or much larger. FIG. 2 of the accompanying drawings is a schematic diagram of a conventional silicon photomultiplier.

APD cells vary in dimension from 20 to 100 microns depending on the mask used, and can have a density of up to 1000/sq. mm. Avalanche diodes can also be made from other semiconductors besides silicon, depending on the properties that are desirable. Silicon detects in the visible and near infrared range, with low multiplication noise (excess noise). Germanium (Ge) detects infrared to 1.7 µm wavelength, but has high multiplication noise. InGaAs (Indium Gallium Arsenide) detects to a maximum wavelength of 1.6 µm, and has less multiplication noise than Ge. InGaAs is generally used for the multiplication region of a heterostructure diode, is compatible with high speed telecommunications using optical fibres, and can reach speeds of greater than Gbit/s. Gallium nitride operates with UV light. HgCdTe (Mercury Cadmium Telluride) operates in the infrared, to a maximum wavelength of about 14 µm, requires cooling to reduce dark currents, and can achieve a very low level of excess noise.

Silicon avalanche diodes can function with breakdown voltages of 100 to 2000V, typically. APDs exhibit internal current gain effect of about 100-1000 due to impact ionization, or avalanche effect, when a high reverse bias voltage is applied (approximately 100-200 V in silicon). Greater voltage can be applied to silicon APDs, which are more sensitive compared to other semiconductor photodiodes, than to traditional APDs before achieving breakdown allowing for a larger operating gain, preferably over 1000, because silicon APDs provide for alternative doping. Reverse voltage is proportional to gain, and APD gain also varies dependently on both reverse bias and temperature, which is why reverse voltage should be controlled in order to preserve stable gain. SPMs can achieve a gain of $10^5$ to $10^6$ by using Geiger mode APDs which operate with a reverse voltage that is greater than the breakdown voltage, and by maintaining the dark count event rate at a sufficiently low level.

Geiger-mode APDs produce relatively large charge pulse when struck by a photon of the same amplitude no matter the energy of the photon. When reading out conventional APDs, noise of the preamplifier significantly degrades timing and amplitude resolution performance for short (shorter than approximately 500 ns) light pulses. Compared to conventional APDs, SPMs using Geiger mode APDs provide much higher output amplitude, essentially eliminating the impact of preamplifier noise.

Many SPM [Silicon Photomultiplier] applications call for a fast light-to-current response, with order of 1 ns or even shorter time constants. Improved time response would benefit such applications as time-resolved spectroscopy, LIDARs, TOF [time of flight] PET [Positron Emission Tomography] etc.

At the moment use of the SPM for 'fast' applications, especially large area SPMs is seriously compromised by the fact that bulk of the SPM's signal charge is released as an exponentially decaying current with a long ~50 ns time constant. However, the avalanche development process in the SPM APD is extremely fast and the long time constant arises due to the fact that the APD signals are read out through the distributed SPM's biasing circuitry.

It is desirable to provide new electrode detector configurations to enhance currently known Silicon Photomultiplier [SiPM], also known as SPM, MicroPixel Photon Counters [MPPC], MicroPixel Avalanche Photodiodes [MAPD] with improved performance in such areas as Positron Emission Tomography [PET], including Time-Of-Flight PET [TOF-PET], Laser Ranging [LIDAR] applications, bio luminescence, High Energy Physics [HEP] detectors.

Currently known Silicon Photomultipliers provide minimum output rise time in the order of 1 nS and fall time of at least 10 ns. This is much longer than conventional vacuum Photomultiplier (PMTs) or silicon avalanche photodiodes (APDs) resulting in performance loss and complication of readout electronics.

There is therefore a need to provide a semiconductor photomultiplier which addresses at least some of the drawbacks of the prior art.

SUMMARY

These and other problems are addressed by providing a semiconductor photomultiplier device having a three electrode connection scheme where two electrodes are used for biasing of the SPM, while a third electrode is used to readout the signal. The third electrode is operably coupled to a plurality of photosensitive cells via common capacitance in order to provide a fast readout of avalanche signals.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

The present teaching will now be described with reference to some exemplary semiconductor photomultipliers. It will be understood that the exemplary semiconductor photomultipliers are provided to assist in an understanding of the teaching and are not to be construed as limiting in any fashion. Furthermore, circuit elements or components that are described with reference to any one Figure may be interchanged with those of other Figures or other equivalent circuit elements without departing from the spirit of the present teaching.

Figure 1:
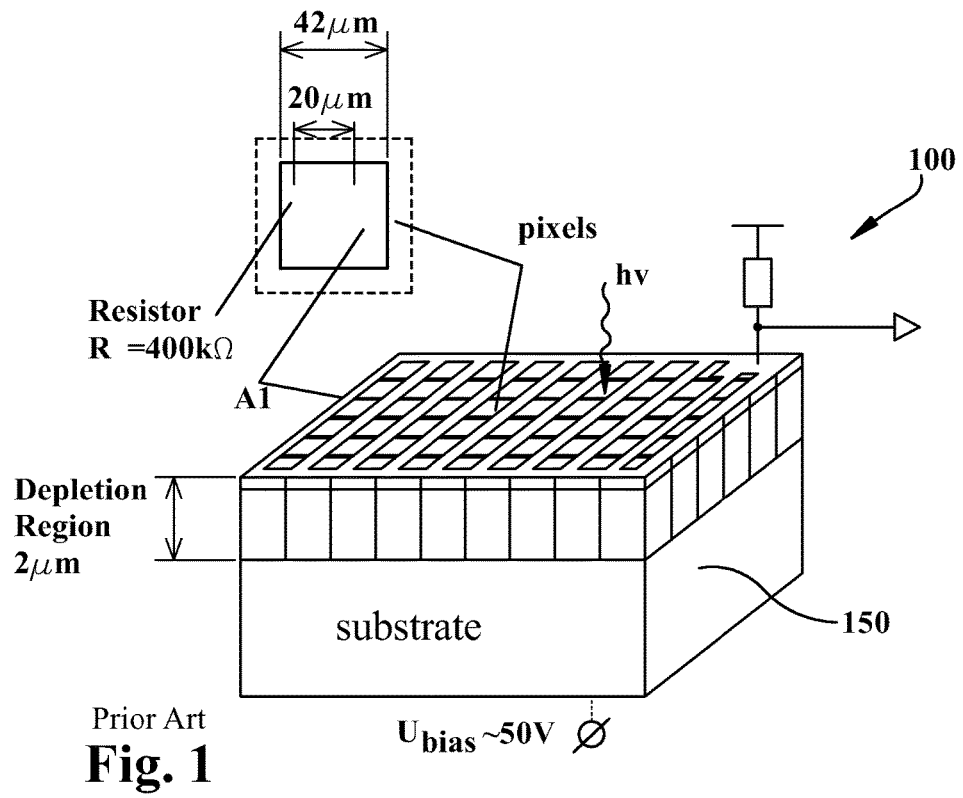
FIG. 1 illustrates the structure of a silicon photomultiplier.

Referring initially to FIG. 1, a silicon photomultiplier 100 comprising an array of Geiger mode photodiodes is shown. The array is formed on a semiconductor substrate 150 using semiconductor processes which will be known to one skilled in the art. Patterned layers of conducting material, insulating material and doped areas of semiconductor form the structure of the photodiode. As illustrated, a quench resistor is provided adjacent to each photodiode which may be used to limit the avalanche current. The photodiodes are electrically connected to common biasing and ground electrodes by aluminium tracking.

Figure 2:
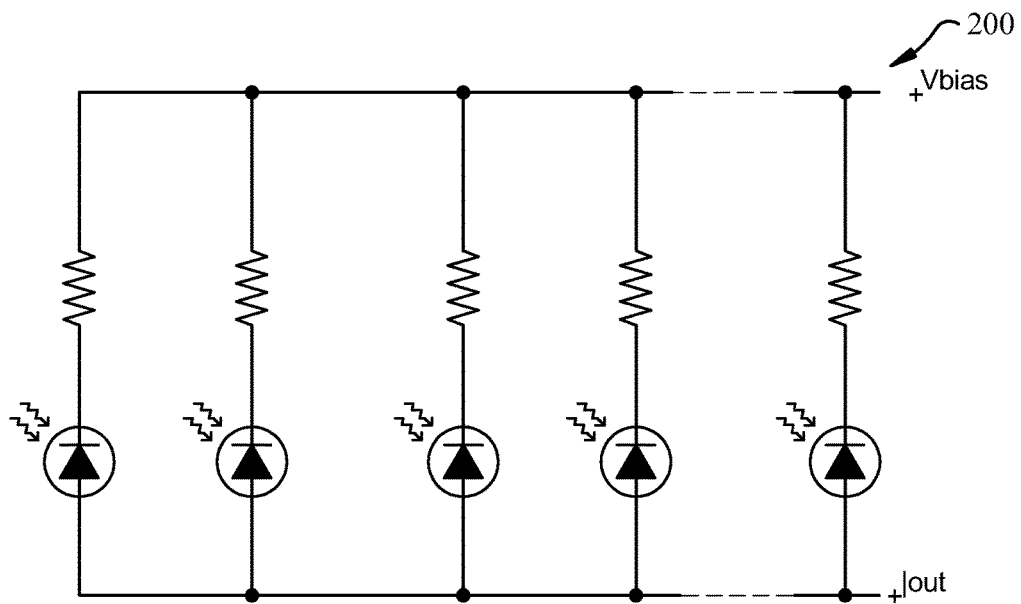
FIG. 2 is a schematic diagram of a prior art silicon photomultiplier.

An equivalent circuit schematic is shown in FIG. 2 for a conventional silicon photomultiplier 200 in which the anodes of an array of photodiodes are connected to a common ground electrode and the cathodes of the array are connected via current limiting resistors to a common bias electrode for applying a bias voltage across the diodes.

In some scintillator readout applications of the known SPMs with fast output it is required to extract energy signal (integral charge) from the fast output. The motivation for that is to reduce number of interconnections and electronics channel. However, the signal present at the fast output is AC coupled with the time constant equal to the quench time. If such time constant is shorter or comparable with the characteristic scintillation time the output signal is going to be distorted (differentiated) resulting in so-called undershoot. The present inventors have realised that is advantageous to increase the quench time constant for the purpose of improving the waveform on the fast output of the fast SPM. When operating with scintillators especially slow scintillators like Bismuth Germanate (tau=300 ns) the fast output waveform is heavily differentiated as a result of AC coupling with the time constant corresponding to the fast terminal (typically 40 ns). Such differentiation creates difficulties for reconstruction of the event energy through the fast output terminal. The quench time constant may be increased to e.g. 1 uSec (value much bigger than tau) thus practically eliminating such distortions. Additional benefit of such increase will be reduced after pulsing in the SPM cells. At the same time the quench time of normal SPM is required to be as small as possible, this allows good rise time of the scintillations signal.

Figure 3:
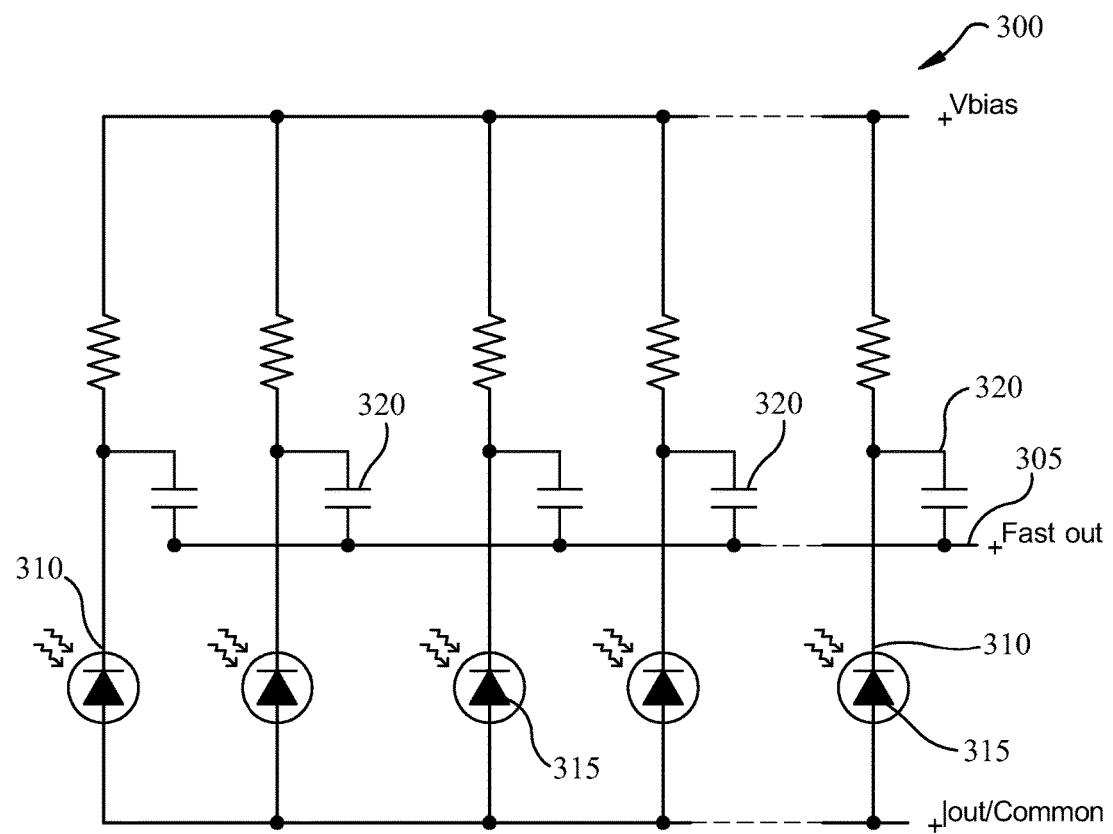
FIG. 3 is a circuit schematic diagram of another prior art silicon photomultiplier with a three electrode connection scheme.

Referring now to FIG. 3 which illustrates a silicon photomultiplier 300 described in PCT Patent Application no. WO 2011/117309 of which the present assignee is the applicant, the contents are incorporated herein by reference. The SPM 300 has a third electrode 305 which is capacitively coupled to each photodiode cathode 310 in order to provide a fast readout of the avalanche signals from the photodiodes 315. When the photodiode 315 emits a current pulse, part of the resulting change in voltage at the cathode 310 will be coupled via mutual capacitance 320 into the third electrode 305. Using the third electrode 305 for readout avoids the compromised transient performance resulting from the relatively large RC time constant associated with the biasing circuit.

Figure 4:
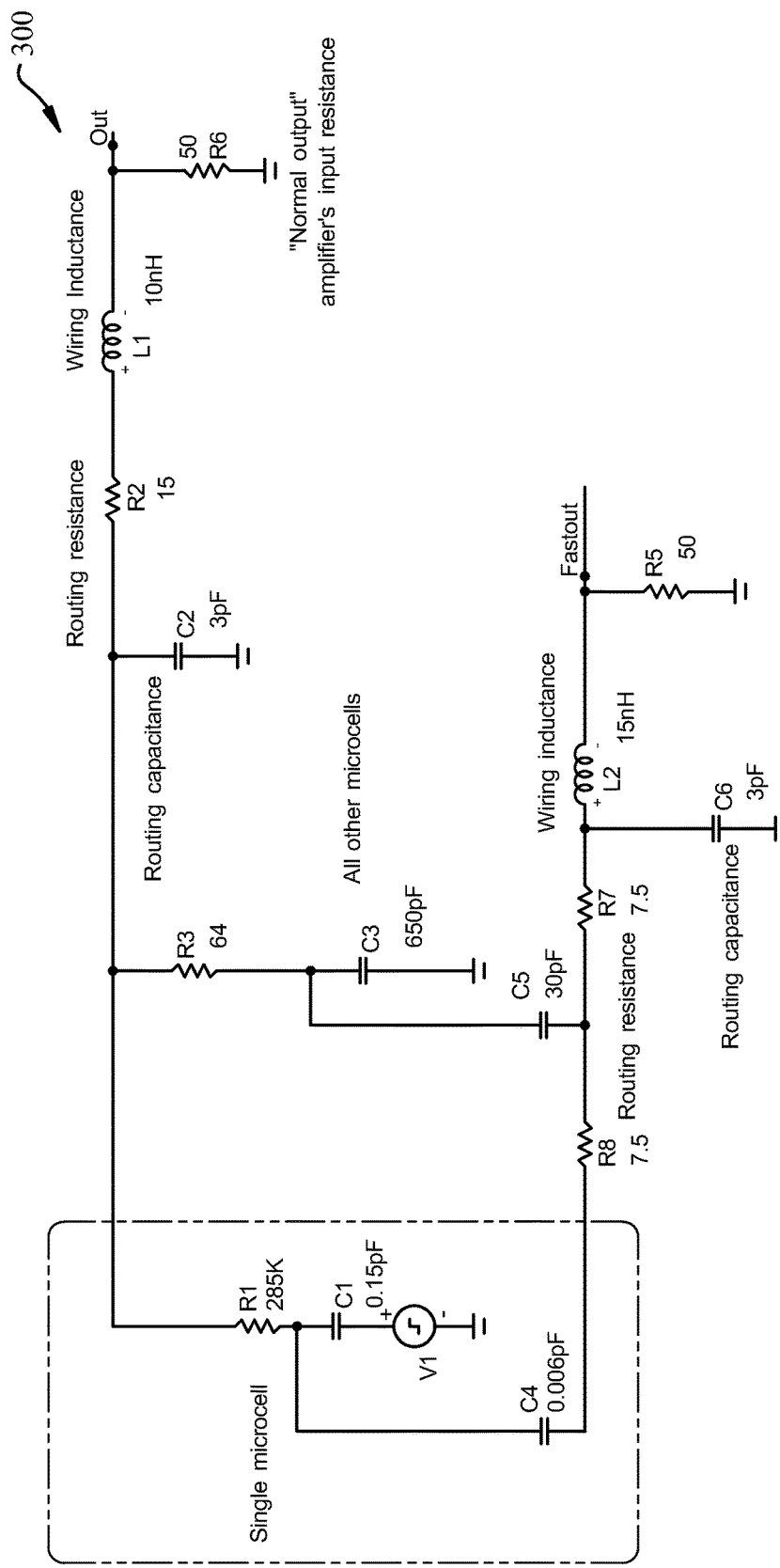
FIG. 4 is an equivalent circuit representation of the silicon photomultiplier of FIG. 3.

FIG. 4 shows an equivalent circuit of SPM 300, the voltage source V1 represents the avalanche voltage of the firing diode, C1 the capacitance of the photodiode 315 and C4 the coupling capacitance 320 between the third electrode 305 and the photodiode 315. The remaining network represents a previously considered biasing circuit and readout approach. In a previously-considered readout the voltage across R6 provides the readout, while the voltage across R5 provides the readout in the SPM 300 of FIG. 4.

Figure 5:
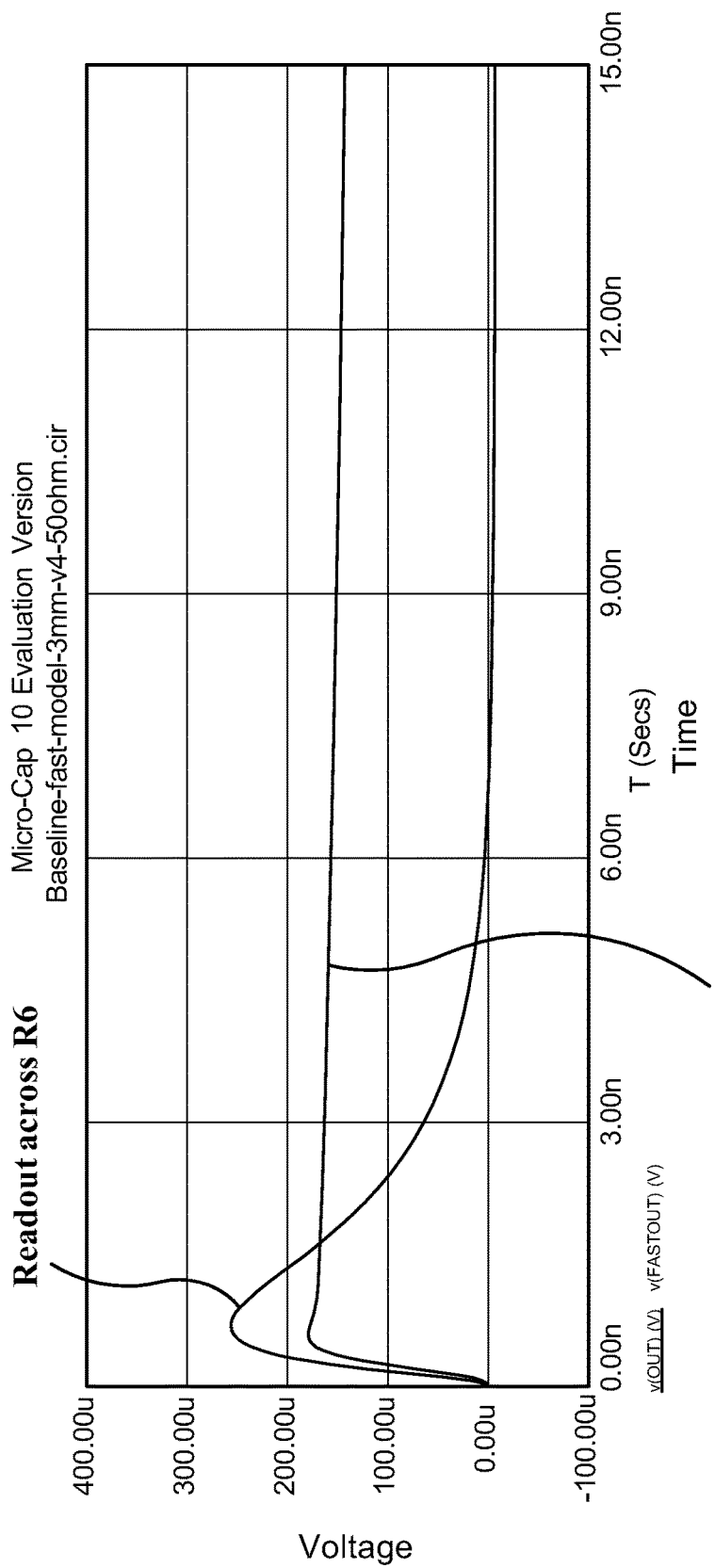
FIG. 5 provides a graphical representation of simulation results using the circuit of FIG. 4.

FIG. 5 shows the results of a simulation using the equivalent circuit of FIG. 4 which compares the rise and fall times of the voltages across R6 and R5 resulting from the injection of a transient avalanche voltage at V1. The voltage across R5 (output of SPM 300) responds more quickly in both rise and fall than the voltage across R6 (output of SPM 200). Semiconductor photomultpliers with fast output known heretofore have several factors limiting their timing performance. These limiting factors include but are not limited to high capacitance of the fast output electrode, series resistance of the fast output electrode, unequal time delay across the device. The limiting factors deteriorate the rise time of the avalanche signal and limit the performance of the silicon photomultiplier in precise timing applications such as Time-Of-Flight Positron Emission Tomography.

Figure 6:
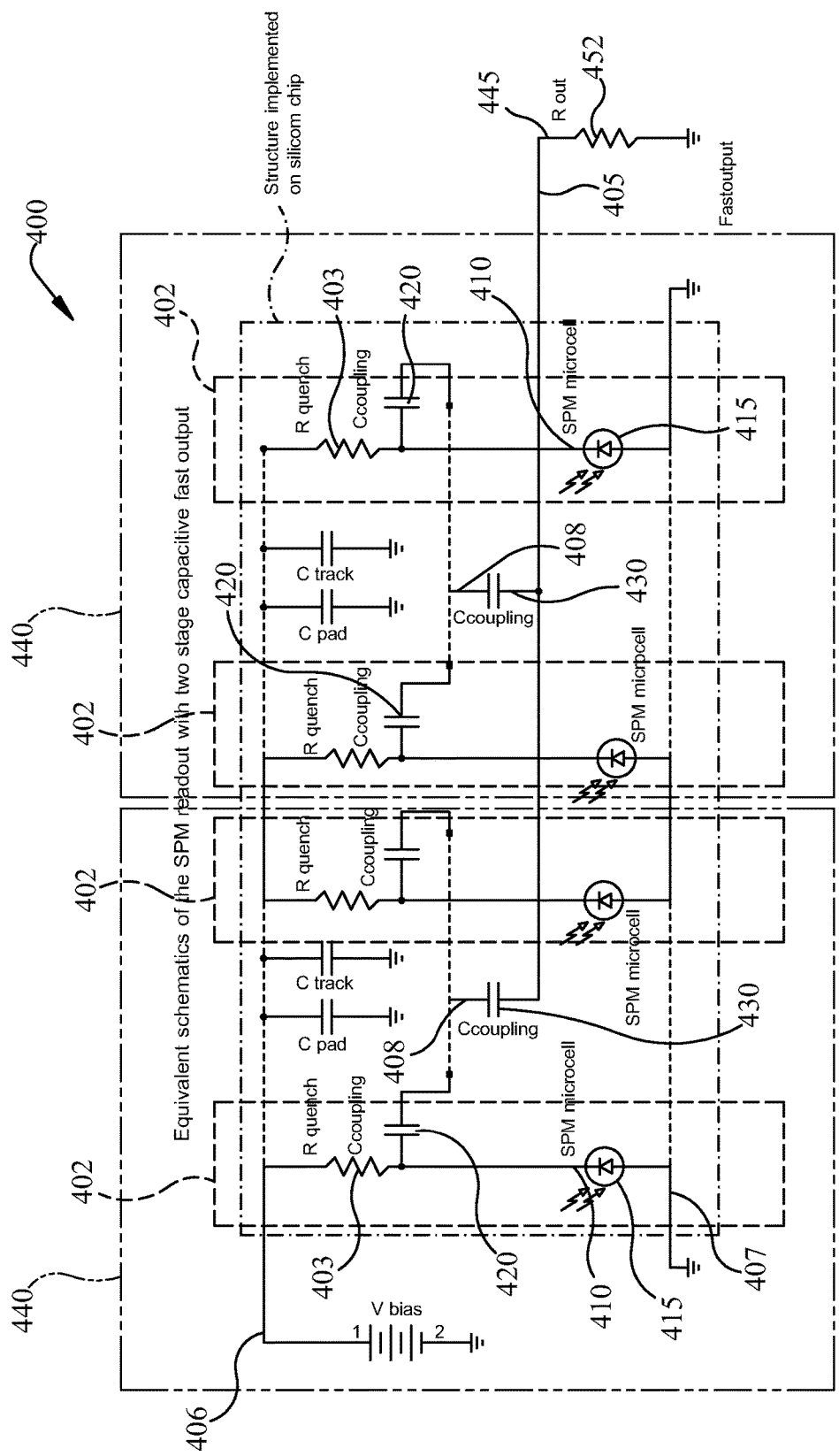
FIG. 6 is a circuit schematic diagram of a semiconductor photomultiplier according to the present teaching.

Referring now to FIG. 6 which provides a semiconductor photomultiplier 400 which addresses at least some of the limiting factors as outlined above by providing first and second stage capacitive coupling. The SPM 400 comprises a plurality of photosensitive cells 402 which have a photodiode 415, a quench resistor 403 and a first stage coupling capacitor 420. A first electrode 406 is arranged to provide a bias voltage to the photosensitive cells 402. A second electrode 407 is arranged to provide a ground signal for the photosensitive cells 402. A coupling node 408 is common to the second stage capacitor 430 of two or more photosensitive cells 402. A third electrode 405 is operably coupled to the coupling node 408 via the second stage capacitor 430 for providing an output signal from the photosensitive cells 402. It will be appreciated that the third electrode 405 is capacitively coupled to each photodiode cathode 410 in order to provide a fast readout of the avalanche signals from the photodiodes 415. Two or more of the first stage capacitors 420 are coupled in a parallel configuration. Each parallel configuration of first stage capacitors 420 are operably coupled in series to a respective second stage capacitor 430. In an exemplary embodiment, the device 400 has an associated quench time constant that is set to a value for optimising the pulse duration of the output signal from the third electrode 405. The quench time duration may be modified to minimise signal distortion on the output signal.

Figure 7:
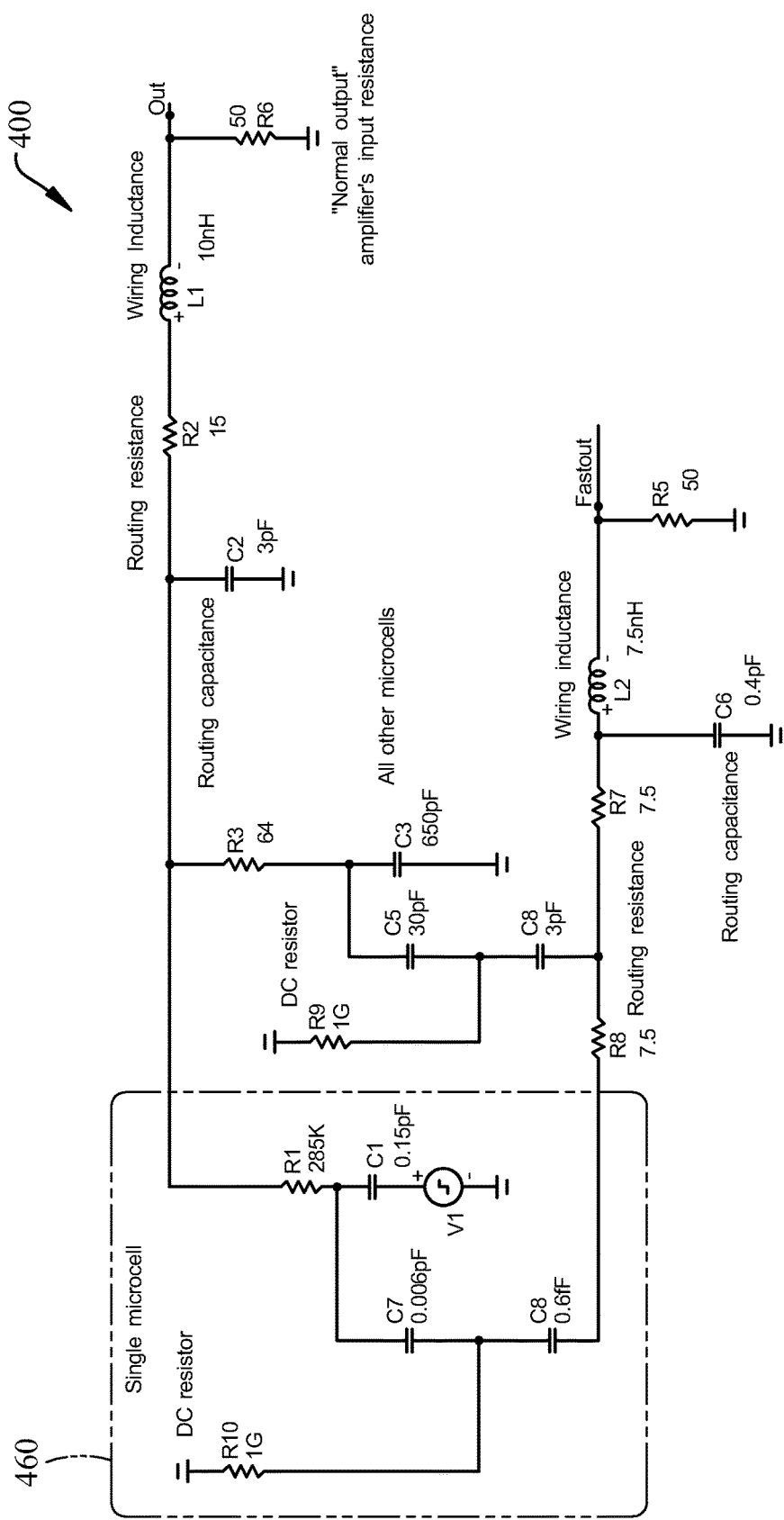
FIG. 7 is an equivalent circuit representation of the semiconductor photomultiplier of FIG. 6.

FIG. 7 shows an equivalent circuit of SPM 400, the voltage source V1 represents the avalanche voltage of the diode, C1 the capacitance of the photodiode 415 and C7 the coupling capacitance of the first stage. The capacitance of the second stage is represented by capacitor C4. The remaining network represents a previously considered biasing circuit and readout approach. In the SPM 400, the voltage across R6 is equivalent to the output of SPM 200, while the voltage across R5 is equivalent to the output of SPM 400. The first stage capacitors 420 are represented by capacitors C7 and C5 and the second stage common capacitors 430 are represented by C4 and C8.

Figure 8:
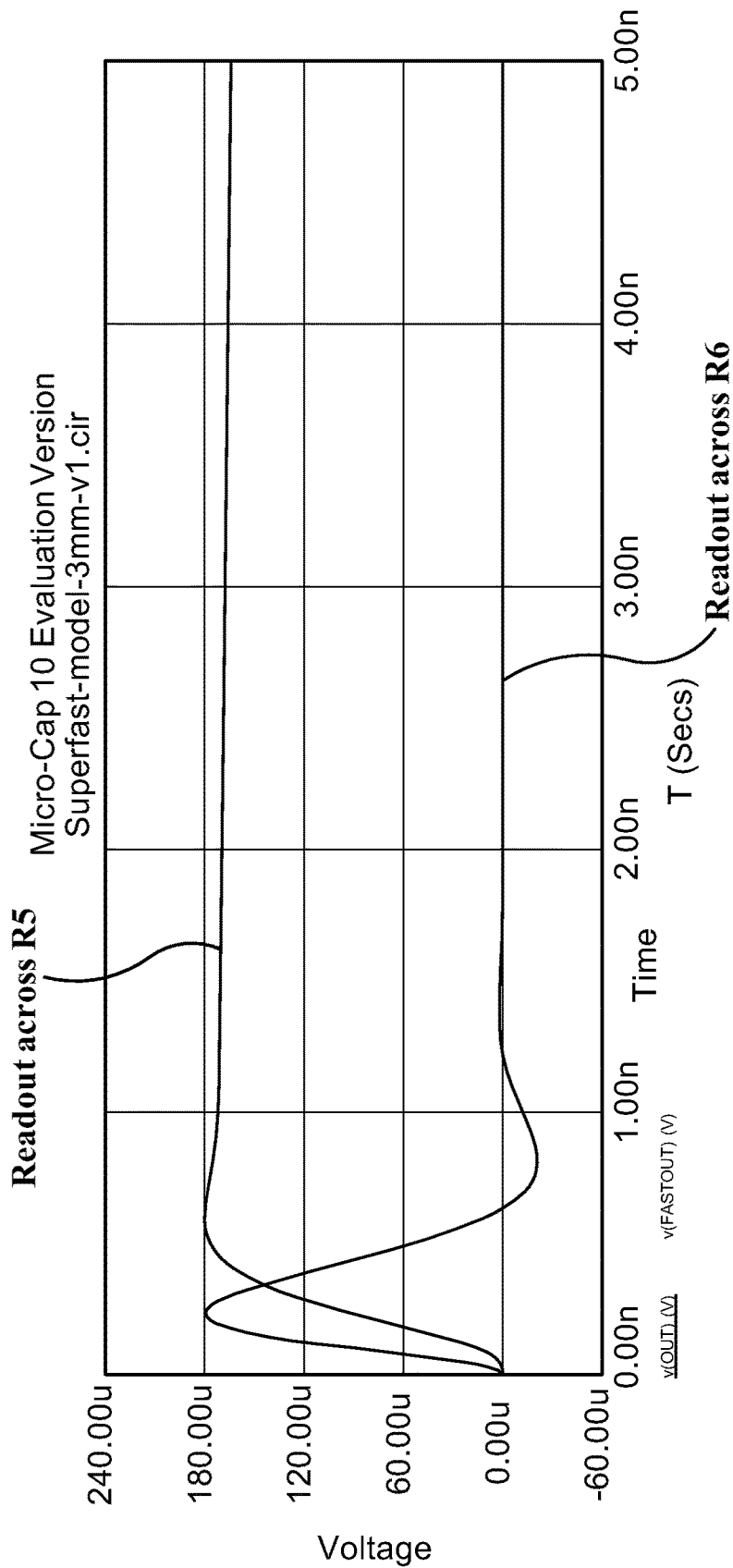
FIG. 8 is a graphical representation of simulation results using the circuit of FIG. 7.

FIG. 8 shows the results of a simulation using the equivalent circuit of FIG. 7 which compares the rise and fall times of the voltages across R6 (output of SPM 200) and R5 (output SPM 400) resulting from the injection of a transient avalanche voltage of 2 volts at V1. The voltage across R5 responds more quickly in both rise and fall than the voltage R6. In the exemplary example, the SPM 400 has dimensions 3 mm*3 mm and has fast output capacitance in the order of 30-35 pF. The fast output capacitance of the initial microcell 460 is calculated by dividing the capacitance of C7 (0.006 pF) by the capacitance C4 (0.6 fF). The fast output capacitance of the remaining microcells is calculated by dividing the capacitance of C5 (30 pF) by the capacitance of C8 (3 pF). In the exemplary embodiment, the ratio of first/second stage capacitors (C7/C4 or C5/C8) is chosen to be 10 which provides a reasonable trade-off between a faster output signal at lower ratio or higher signal amplitude at higher ratio. The ratio of the first/second stage capacitors may be in the range of 1 to 20. Ideally, the ratio of the first/second stage capacitors is in the range of 5 to 15. In combination with parasitic series resistance of the order of 15 ohm and inductance in the order of 10-15 nH the minimal pulse obtained across R5 of SPM 400 is approximately 1.5 nsec for readout impedance of 10-12 ohm.

A transimpedance amplifier which converts current to voltage may be used for converting the current signal flowing through the output resistors R5 and R6. Transimpedance amplifiers are typically used in receivers for optical detectors. The current generated by a photodetector typically provides a voltage across an output resistor in a non-linear fashion. The transimpedance amplifier generates a low impedance 50 Ohm signal to drive a coaxial cable. The pulse which may be obtained across R6 is approximately 2-3 nsec for a 50 ohm readout impedance (standard coaxial cable or low noise amplifier). Such pulse width (1.5 nsec to 3 nsec) is much longer than the intrinsic timing resolution of the SPM 300 which is in the order of 0.1 nsec. Therefore, the timing performance of the SPM 300 while being better than SPM 200 experiences rather long pulse responses which is undesirable.

The use of two stage capacitive coupling in the SPM 400 reduces the output capacitance and therefore the impact of readout impedance on timing thus allowing the use of a 50 ohm impedance element for reading out the avalanche signal. Transimpedance amplifiers are very sensitive to parasitic non-resistive impedances between the SPM and the transimpedance amplifier. Thus the second stage capacitors 430 remove constraints on the use of transimpedance amplifiers. Furthermore, the impact of on-chip and package-related parasitic resistance and capacitance are decreased therefore increasing bandwidth. As illustrated in FIG. 8 the two stage capacitive coupling of SPM 400 significantly decreases the pulse response duration by a factor of approximately 4 compared to SPM 300. The capacitance of the third electrode 405 with the photodiode cathodes may be between 2% and 20% of the total silicon photomultiplier capacitance. The capacitance of the third electrode with the photodiode cathodes may be approximately 10%.

Figure 9:
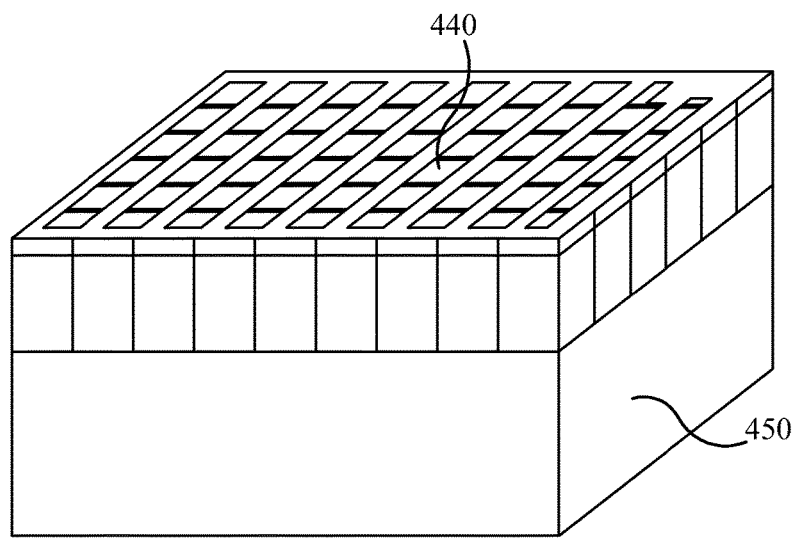
FIG. 9 illustrates a structure comprising the semiconductor photomultiplier of FIG. 6.

When the photodiode 415 emits a current pulse, part of the resulting change in voltage at the cathode 410 will be coupled via mutual capacitance 420 into the third electrode 405. Using the third electrode 405 for readout avoids the compromised transient performance resulting from the relatively large RC time constant associated with the biasing circuit. It will be appreciated by those of ordinary skill in the art that the SPM 400 is made up of an array of Geiger-mode avalanche photodiode microcells 440 on a silicon substrate 450 as illustrated in FIG. 9. The microcells 440 are arranged in a matrix formation. A common capacitor 430 is provided for every row of the microcells 440. Each microcell 440 is connected to one another to form one larger device with one signal output which is read from node 445. A readout resistor 452 is operably coupled between the node 445 and the ground electrode 407.

Figure 10:
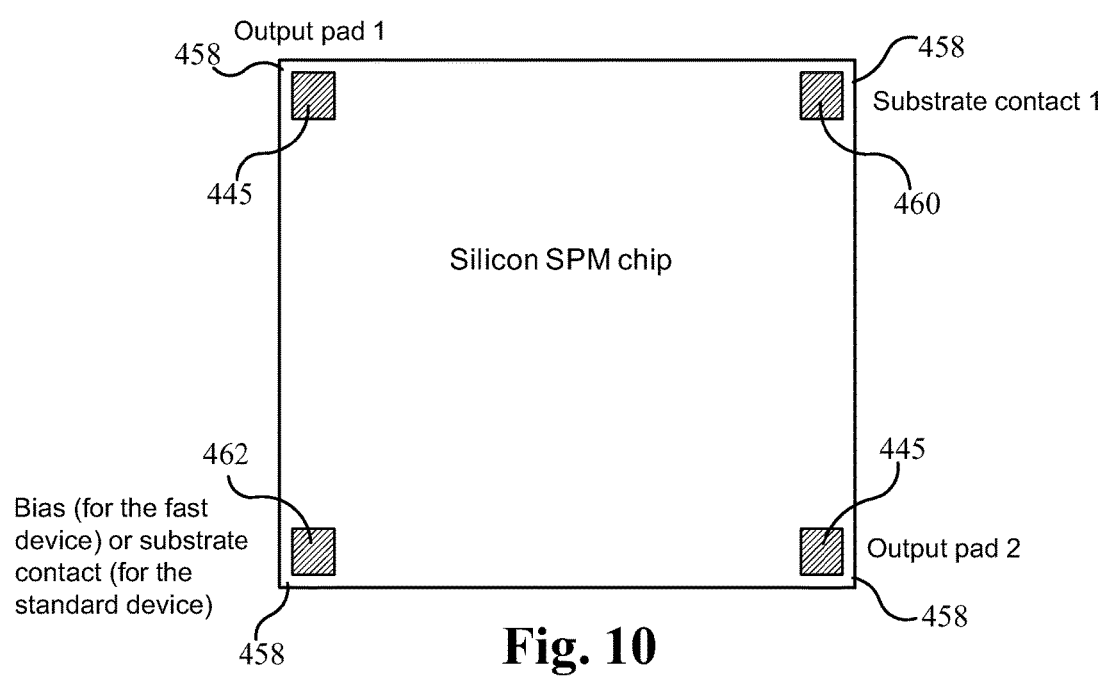
FIG. 10 illustrates a footprint of the structure of FIG. 9 highlighting the locations of the output pads.

The substrate 450 may be coupled to a lead frame comprising a plurality of leads (not shown) which are wire bonded to corresponding electrically conductive contact pads of the substrate 450. Lead frames are incorporated into semiconductor devices during fabrication to support the circuit die during packaging. The substrate 450 and portions of the leads of the lead frame are encapsulated in an encapsulating housing formed from a mouldable compound, typically, an epoxy resins. The distal portions of the leads extend through the encapsulating housing for facilitating electrical coupling the SPM 400 to other components such as a printed circuit board. The conductive contact pads on the substrate 450 may include a bias contact 462 electrically coupled to the first electrode 406 and a substrate contact 460 electrically coupled to the second electrode 407, as illustrated in FIG. 10. Thus it will be appreciated by those of ordinary skill in the art that the bias contact 462 and the substrate contact 460 are used to provide a biasing of the SPM 400. For convenience like components in the Figures are indicated by similar reference numerals.

Figure 11:
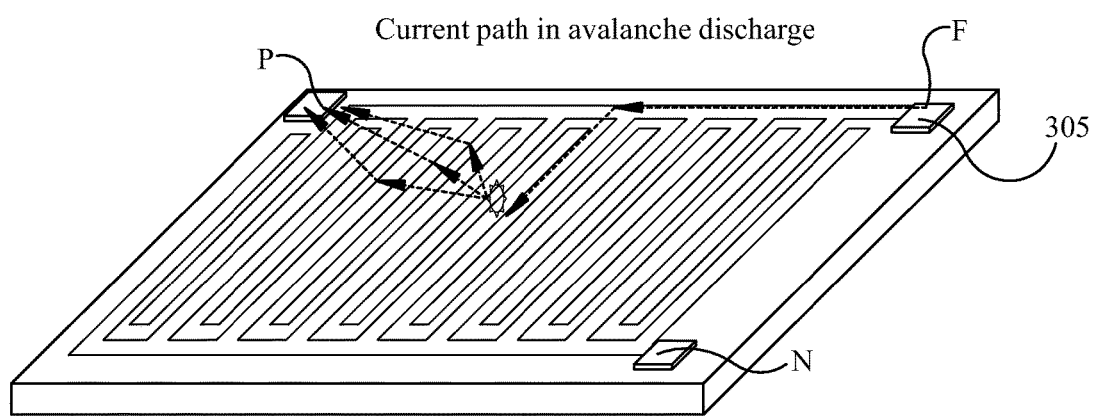
FIG. 11 is a perspective view of a layout of an SPM with a single fast output pad.

The present inventors have realised that it is advantageous to include two readout contact pads 445 on the substrate 450 for facilitating reading out the avalanche signal from the SPM 400 as illustrated in FIG. 10. The two readout contact pads 445 are electrically coupled to the third electrode 405. The signal delay and shaping by parasitics of the signal routing is not uniform across the SPM, resulting in significant time walk (delay) of the signals across the SPM. The present inventors have realised that this limiting factor is at least partially reduced by providing two contact pads which are positioned diagonally to each other on the substrate 450 during fabrication. In the exemplary arrangement the output pads 445 are connected to two separate metal buses which are provided with capacitive coupling to each summed capacitive fast output of each row of the microcells 440. The two buses equalises the readout conditions for the microcells 440. As illustrated by the arrows in FIG. 11, the signal path length from the firing microcell 402 to the fast output terminal significantly depends on the position of the microcell 402. Such effect is highly undesirable since it limits the timing performance of the SPM. For example; the fundamental signal propagation delay may be estimated as follows. For low resistivity silicon (0.02 ohm²cm or so, typically used for Silicon Photomultipliers) the skin effect is in range of frequencies of interest (below 2 GHz), one can assume that the electrical field of the on-chip signal transmission penetrates into the bulk silicon and it becomes the main contributor to the dielectric properties of this transmission line. In the case of 3×3 mm device the variation in the on-silicon signal transmission length is going to vary in the range from essentially 0 mm for microcells close to the fast output pad 305 to up to 3+3=6 mm for the microcells 402 diagonal to the fast readout pad 305. Such length results in a timing spread of $$dT = \mathrm{sqrt}(\in) * L/c = \text{approx. 70 psec}$$

where: $\in = 12$ is the dielectric constant of silicon,
L=6 mm is the transmission length
c=3*10^8 m/sec.

Figure 12:
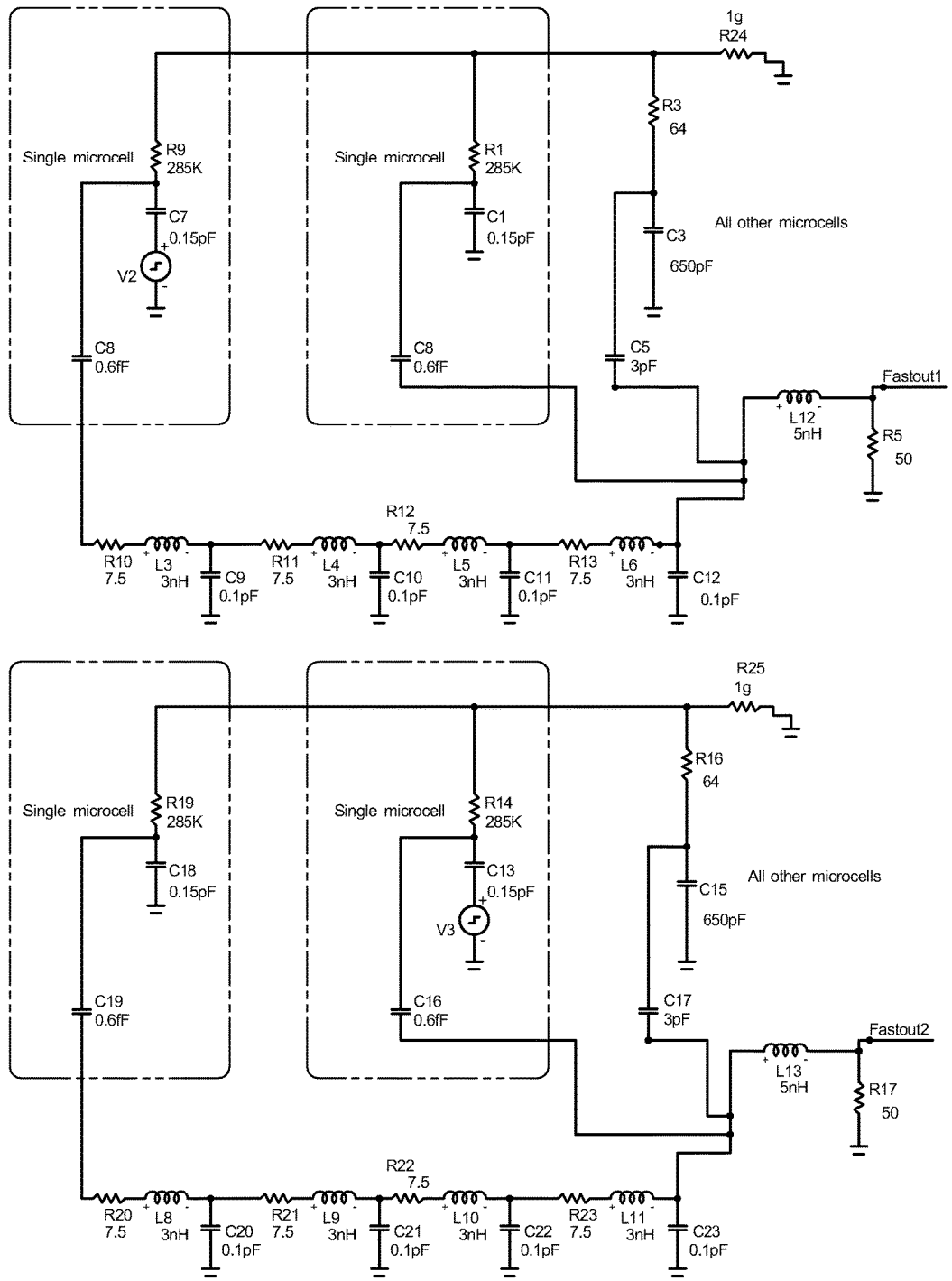
FIG. 12 is a schematic circuit diagram of two microcells that are located at diagonally opposing locations on a device.
Figure 13:
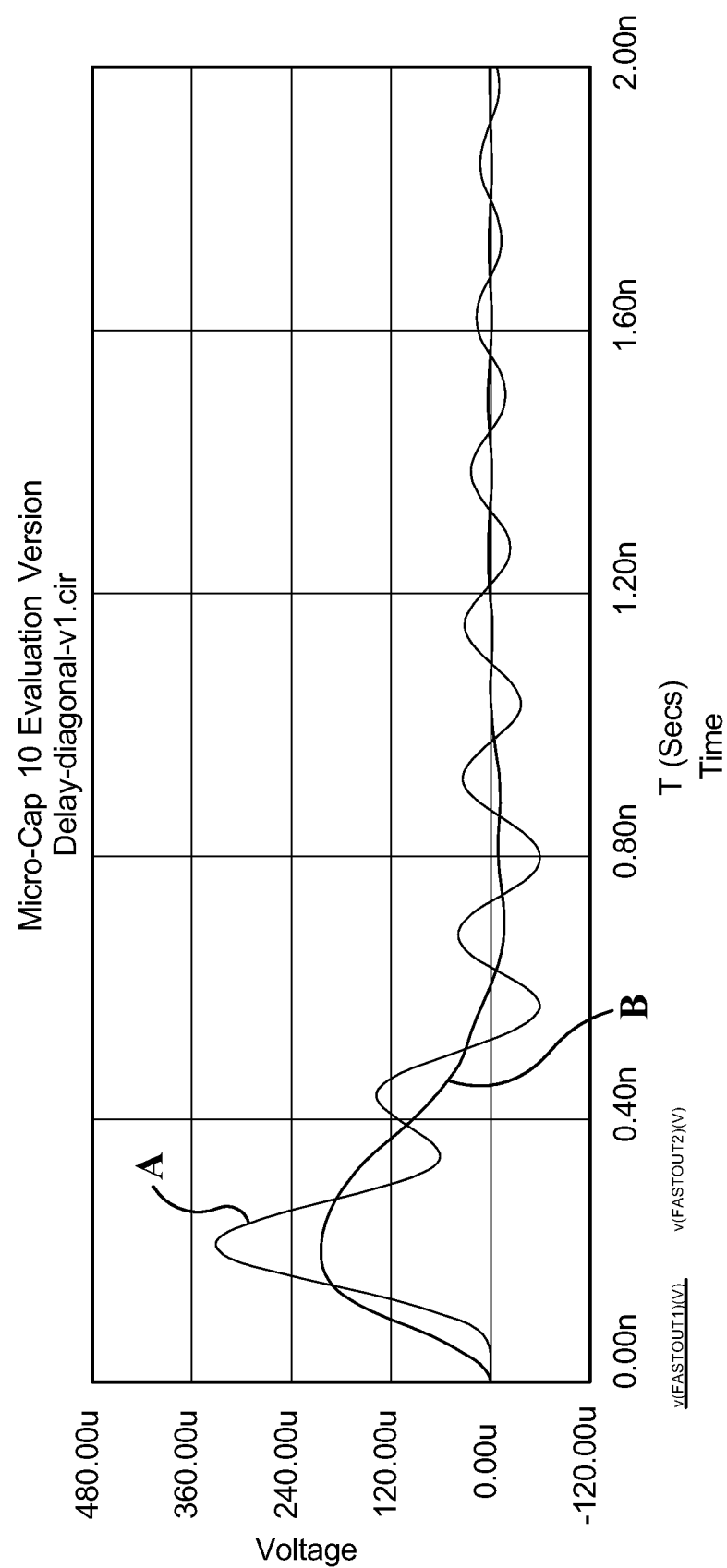
FIG. 13 are the simulation results of the output signals of the two microcells of FIG. 12 when the device has a single output pad.
Figure 14:
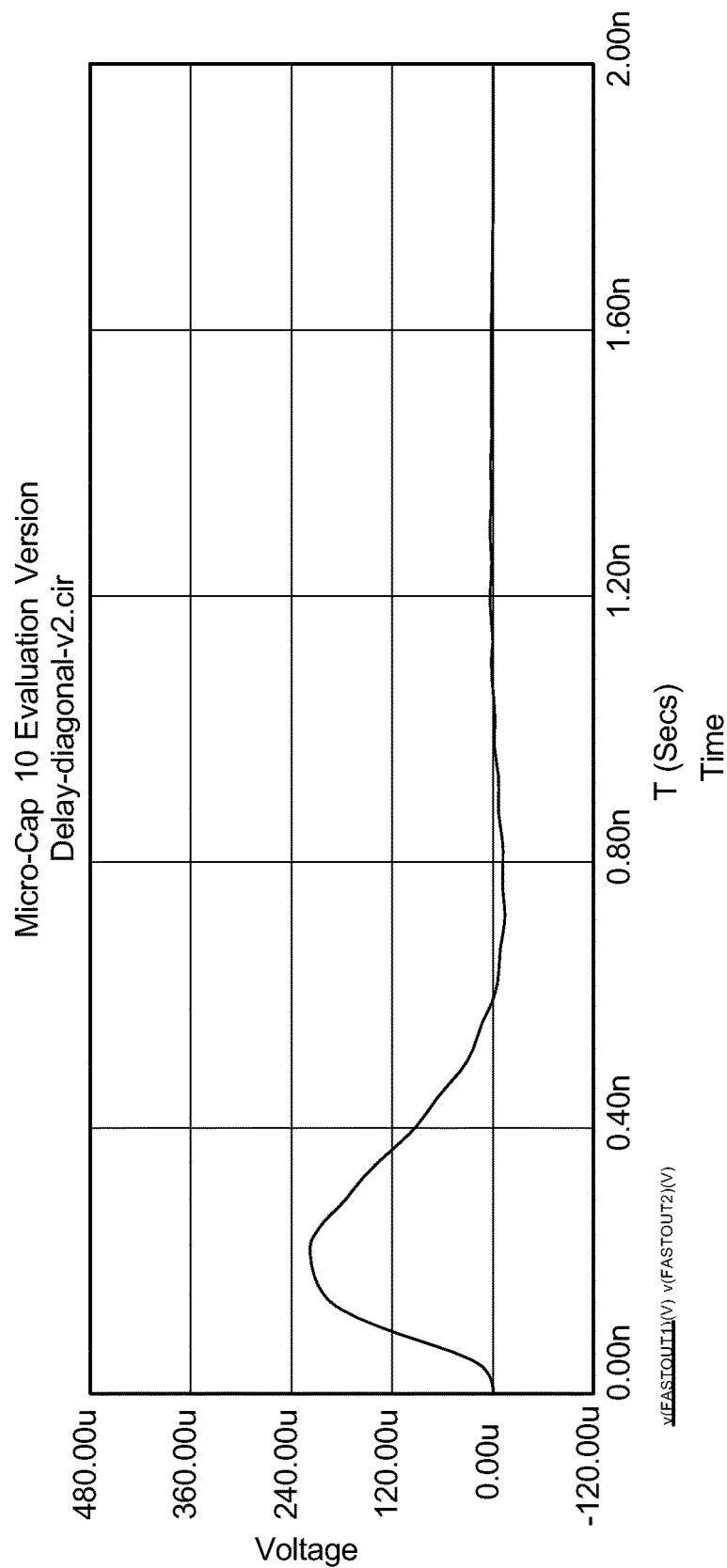
FIG. 14 are the simulation results of the output signals of the two microcells of FIG. 12 when the device has two output pads at diagonally opposing locations on the device.
Figure 15:
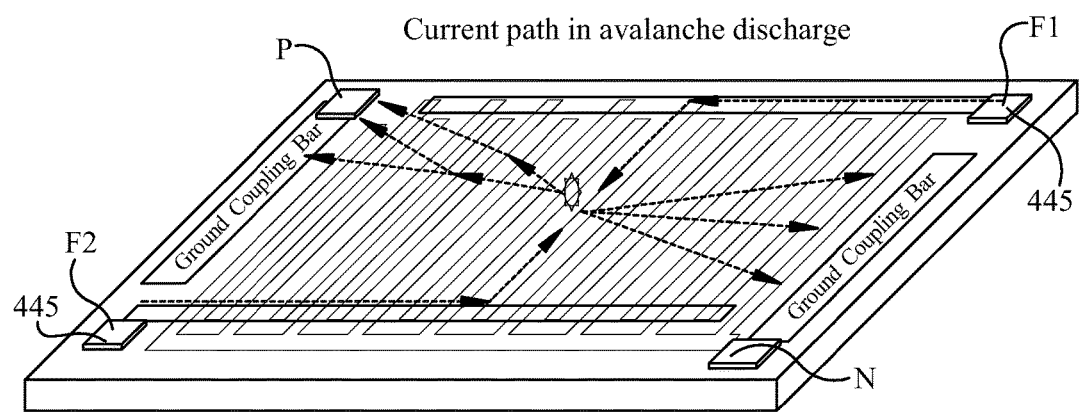
FIG. 15 is a perspective view of a layout of an SPM device.

If a timing performance of approximately 40 ps RMS is desired such variation becomes a significant contributor to the overall timing performance. A SPICE model simulation is shown in FIG. 13 illustrating two waveforms from diagonally positioned microcells which are illustrated in FIG. 12. The two waveforms referenced by letters 'A' and 'B' in FIG. 13 illustrate the signal 'time walk effect' of the two microcells as result of the transmission paths being of different lengths. The present inventors have realised that the 'time walk effect' may be reduced by providing two or more output contacts which are electrically coupled to the third electrode (fast electrode). In the exemplary arrangement, two diagonally positioned output pads are provided. The signal propagating through these outputs pads are summed externally to the device while preserving equal delay. An additional benefit of having multiple output pads is that the effective inductance of the output is decreased. A SPICE model simulation is shown in FIG. 14 illustrating two waveforms representing the output signal from diagonally positioned microcells illustrated in FIG. 12. The two waveforms appear superimposed in FIG. 14 as both output signals experience the same time delay as the length of their transmission path is substantially equal. In orders to provide better return current conditions the device may also include two output ground pads referenced by letters 'P' and 'N' in FIG. 15. The two output ground pads 'P' and 'N' may be implemented using a two layer metal conductor allowing for either capacitive or direct connection ground coupling bars.

Furthermore, the two buses are electrically coupled externally to the SPM 400 to provide minimal output inductance and series resistance. In plan view the SPM 400 defines a footprint that is substantially square with four respective corners 458 as illustrated in FIG. 10. The output pads 445 are located adjacent diametrically opposing corners 458 of the footprint. The substrate contact 460 and the bias contact 462 are located adjacent the other respective corners 458. In the two output pad arrangement, when using standard 90-degree signal routing technique, the average length to the output pads 455 is constant for any microcell 440 in the SPM 400. Since the typical propagation delay for a few mm silicon device is quite small (less than 100 of picoseconds) which is smaller than the typical rise time of the signal, the arrangement preserves uniformity of the rise time of the signal from any microcell 440. The two output pad arrangement may be applied to either of the SPM 300 and the SPM 400, for convenience, only the SPM 400 is described above. However, the advantages of providing two output pads 445 for reading the avalanche signal from the SPM may be applied to any type of SPM which has a three electrode connection scheme. While the footprint has been described as being a square, it is envisaged that the footprint may define any desirable configuration having diametrically opposing locations. Thus the footprint may include different polygonal shapes other than a square such as rectangle, for example.

Figure 16:
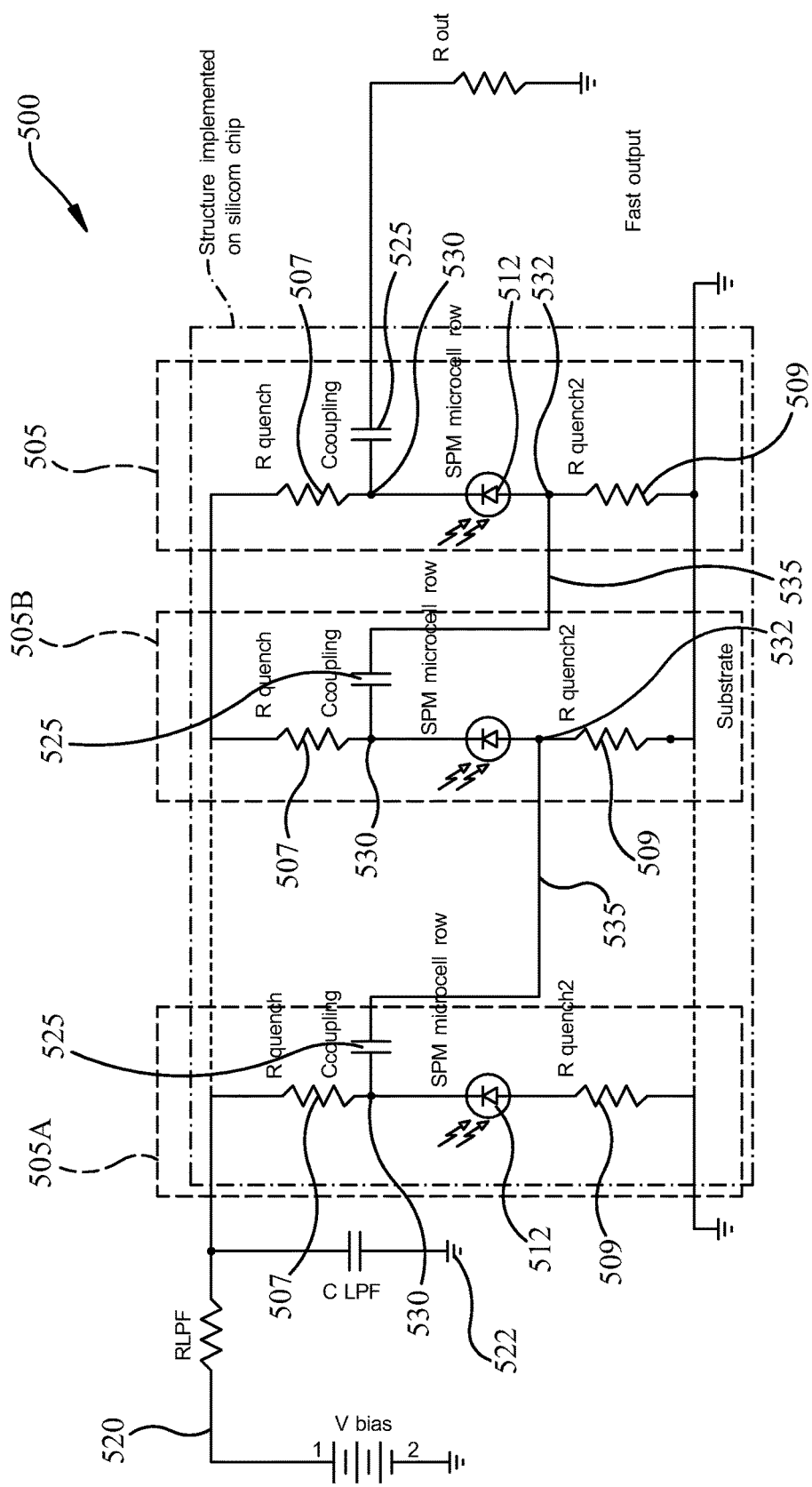
FIG. 16 a circuit schematic of an SPM device with an output electrode in a daisy chain configuration.
Figure 17:
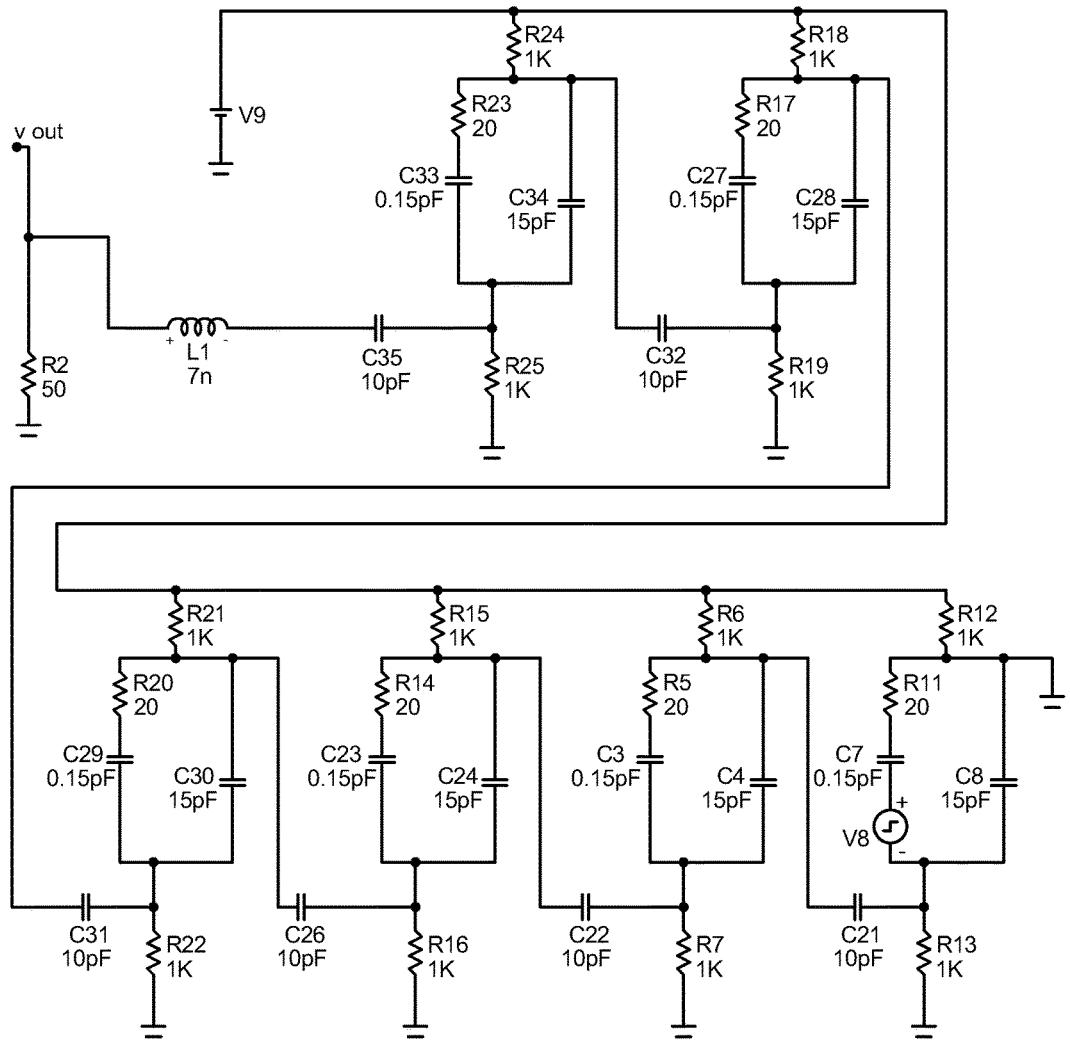
FIG. 17 is an equivalent circuit representation of the microcells of FIG. 16.
Figure 18:
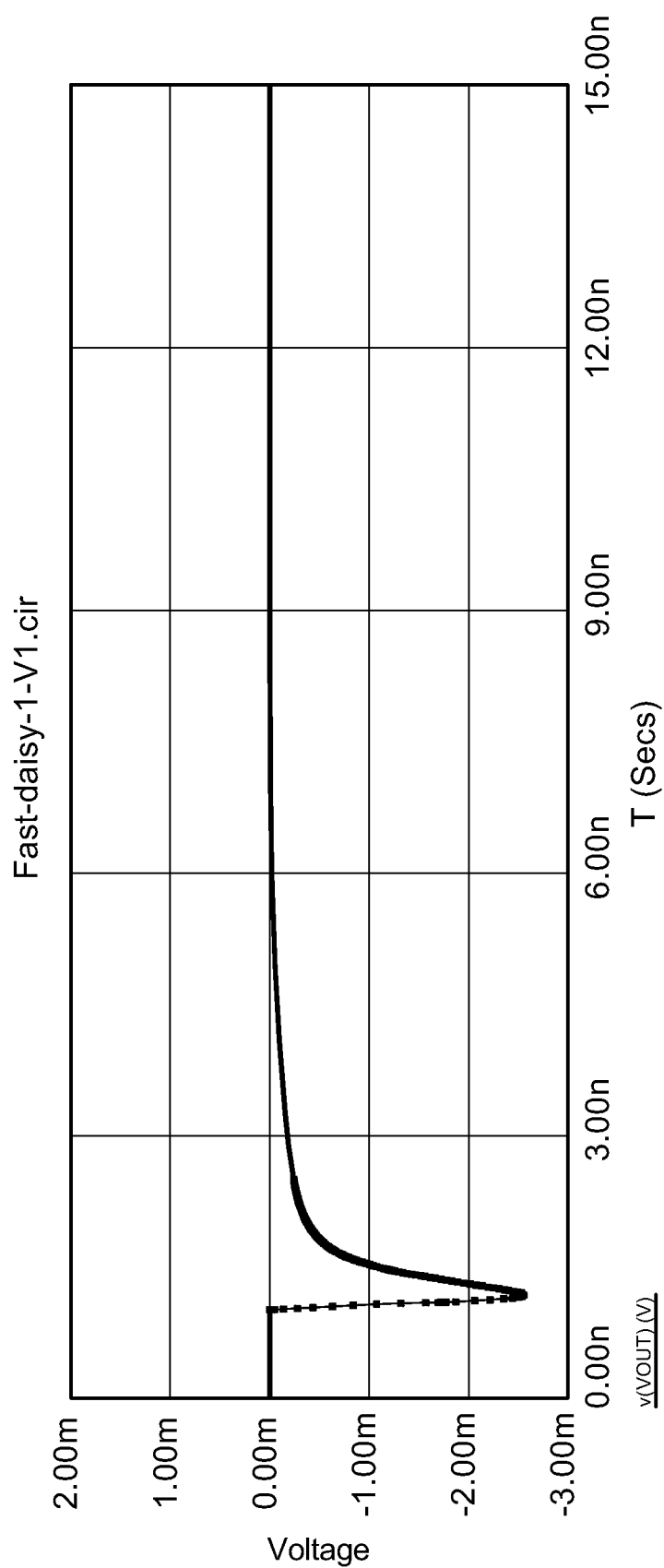
FIG. 18 is a simulated graphical representation of an avalanche signal from right most microcell of a matrix of microcells.
Figure 19:
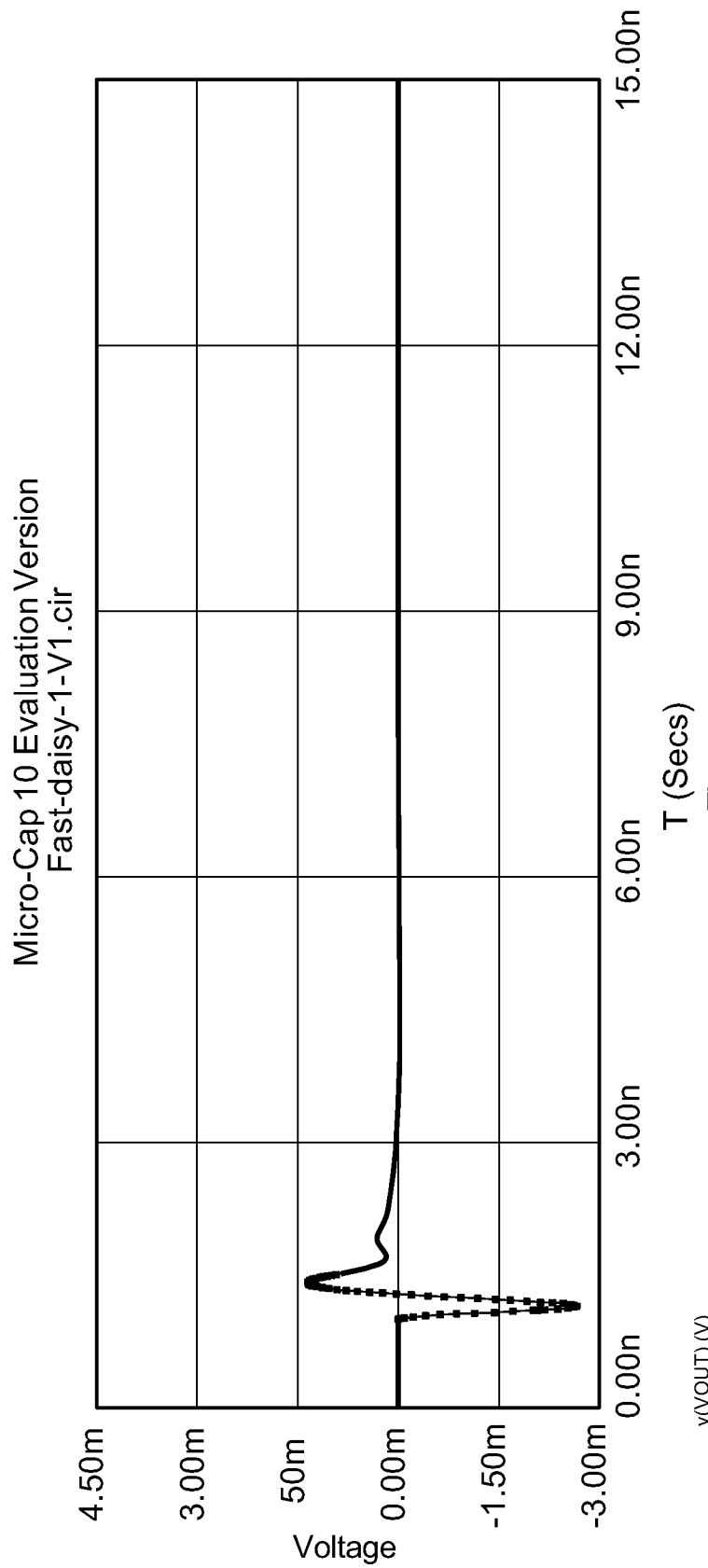
FIG. 19 is a simulated graphical representation of an avalanche signal from a centre microcell of a matrix of microcells.
Figure 20:
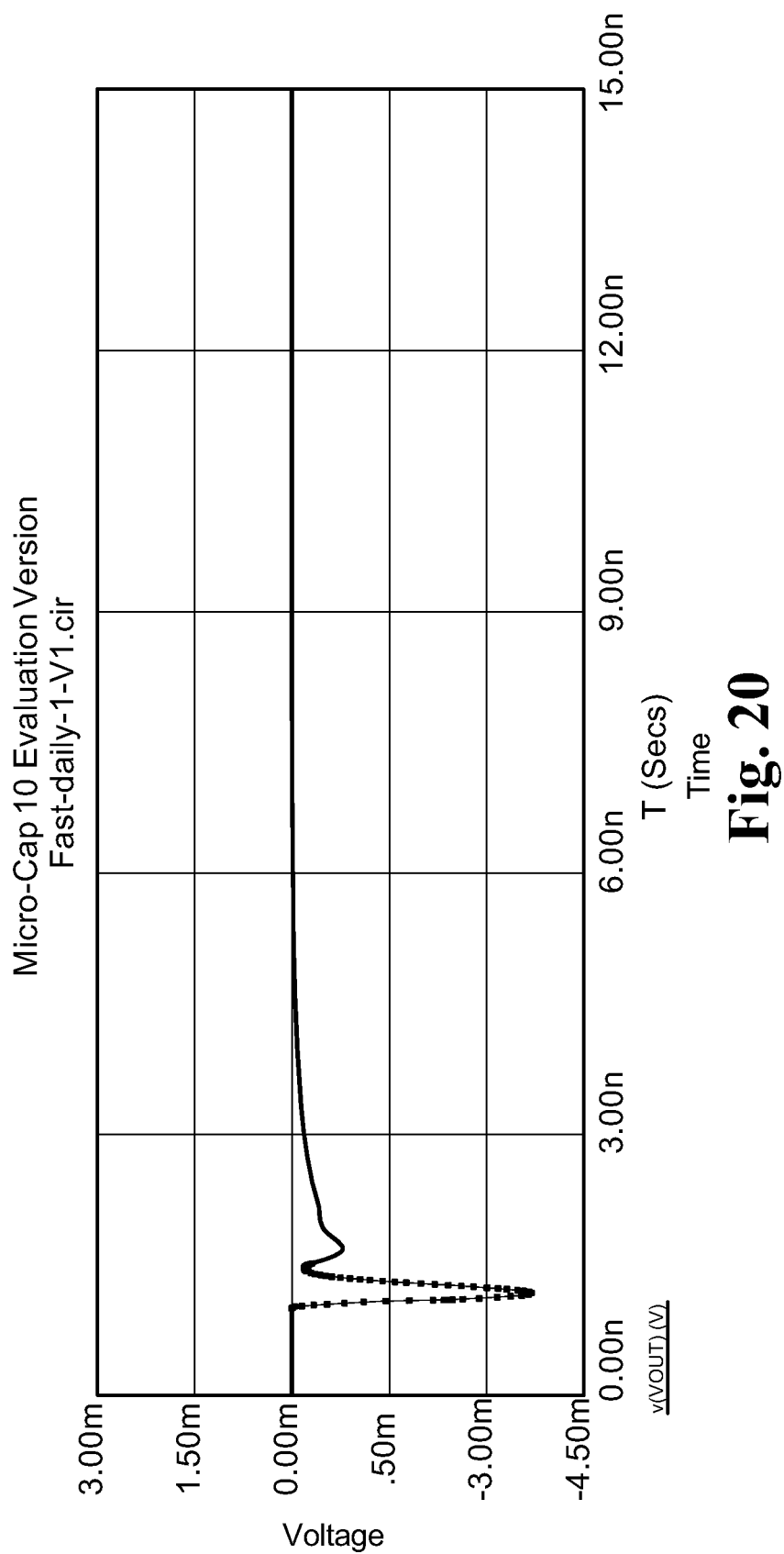
FIG. 20 is a simulated graphical representation of an avalanche signal from the left most microcell of a matrix of microcells.

Referring now to FIG. 16 which illustrates a silicon photomultiplier device 500 which comprises a plurality of photosensitive cells 505 in a daisy chain configuration. The capacitance of the fast output of SPMs may be quite high and therefore limits the readout speed of the SPM. The SPM 500 addresses this drawback by dividing the device into effectively separate smaller silicon photomultipliers organized in rows and insulated from the silicon substrate by use of a second quench resistor. Each of these rows has a fast output terminal which may be daisy chained with the well contact from an adjacent row. This way, the fast output of the device is organized as a series chain of discrete photosensitive cells 505. Each photosensitive cell 505 comprises a first quench resistor 507 and a second quench resistor 509 which together define a voltage divider configuration. A photodiode 512 is operably coupled between the first and second quench resistors 507, 509. The cells 505 are operably coupled between a first electrode and a second electrode, namely, Vbias 520 and ground 522 for biasing the cells. The first quench resistor 507 is associated with Vbias 520 and the second quench resistor 509 is associated with ground 522. A coupling capacitor 525 is operably coupled to an output node/terminal 530 which is common to the first quench resistor 507 and cathode of the photodiode 512. An input node/terminal 532 is common to the anode of the photodiode 512 and the second quench resistor 509. A third electrode 535 is capacitively coupled between the output node 530 of the photosensitive cell 505A and the input node 532 of the photosensitive cell 505B via the coupling capacitor 525. The output signal is provided across Rout. An equivalent circuit of SPM 500 is provided in FIG. 17 which includes six microcells, for convenience, only three microcells are illustrated in FIG. 16. The daisy chain arrangement of SPM 500 provides a significant decrease in the output capacitance of the device while preserving the output charge as illustrated in FIGS. 18 to 20. FIG. 18 is a simulated avalanche signal output from a microcell in the right most row of the matrix. FIG. 19 is a simulated avalanche signal output from a microcell in the middle row of the matrix. FIG. 20 is a simulated avalanche signal output from a microcell in the left most row of the matrix.

Figure 21:
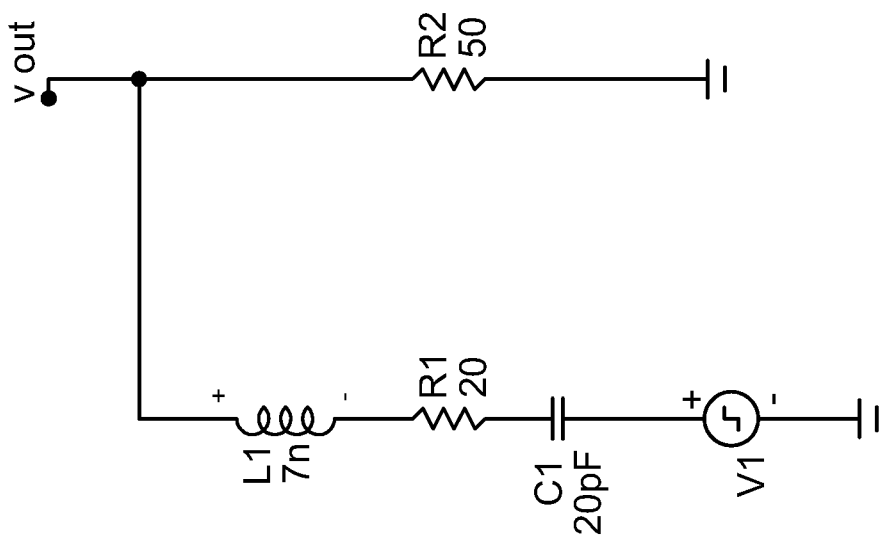
FIG. 21 is an equivalent circuit of the SPM of FIG. 3.
Figure 22:
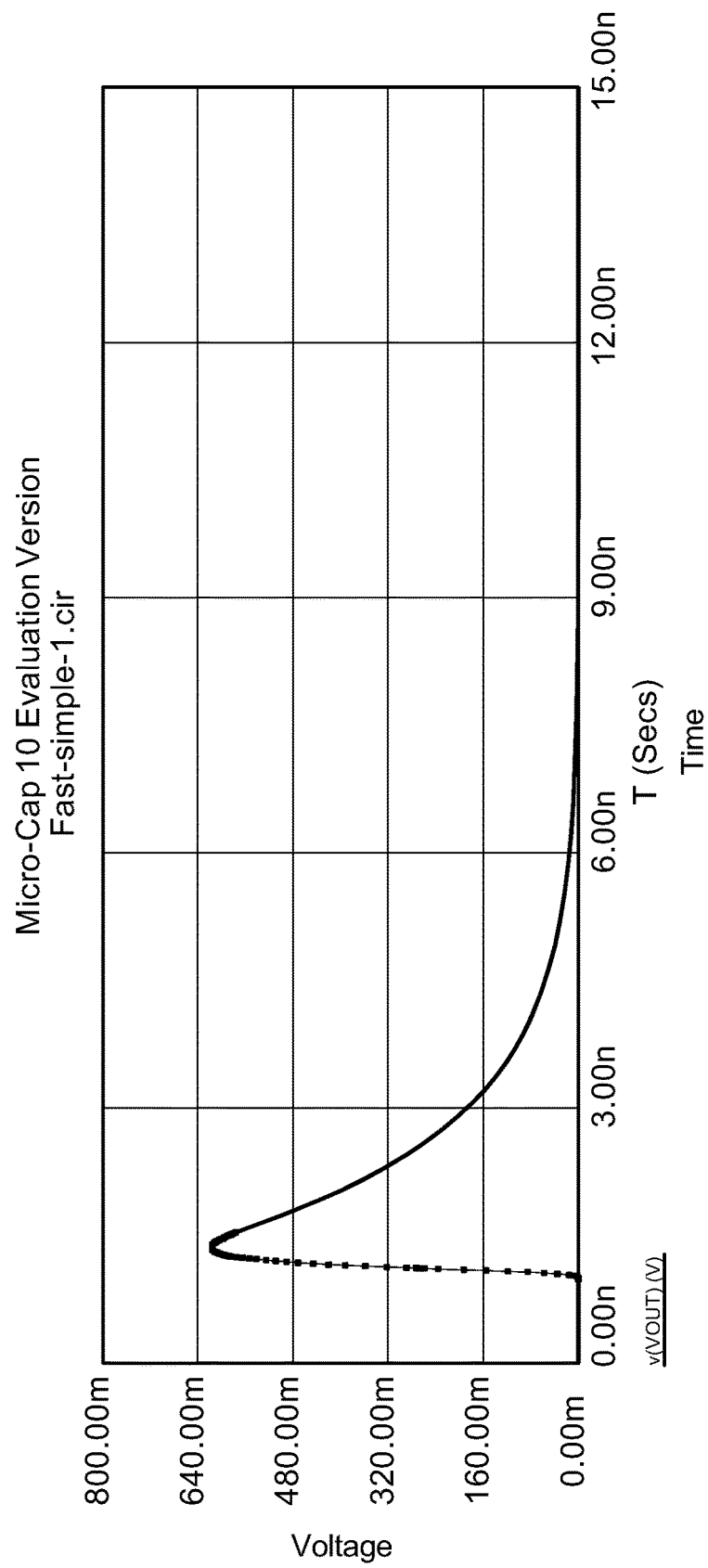
FIG. 22 is a graphical representation of a simulated output from the circuit of FIG. 21.

FIG. 21 is another equivalent circuit of the SPM 300 illustrated in FIG. 3 where the avalanche signal of all the photodiodes 310 are modelled collectively as a variable voltage source V1, all the coupling capacitors 320 are modelled collectively as a capacitor C1, and all the quench resistors are modelled collectively as a resistor R1. L1 represents inductance parasitics and Vout corresponds to the fast out terminal 305. The combined avalanche currents from the photodiodes flows through the output resistor R2. FIG. 22 is a simulation of the output voltage across R2 as a result of the combined avalanche currents which has a significantly larger rise and fall times than the outputs in FIGS. 18, 19 and 20 reinforcing that the daisy chain arrangement of SPM 500 provides a significant decrease in the output capacitance of the device while preserving the output charge.

It is desirable to obtain fast rise time for the output signal typically in the order several nanoseconds or less. It is also desirable to have wideband width and low noise amplification. Taking as example a 3*3 mm SPM device with a fast output capacitance of approximately 35 pF a desirable timing performance may be 100 pico-second timing jitter. The fast output capacitance of 35 pF with a 50 ohm readout resistive load will result in a pulse signal rise time of:

$$Tau=CR=1.8\ nsec$$

A basic estimate demonstrates that a standard 50 ohm match low noise amplifier having noise level of about $P=1\ nV/sqrt(Hz)$ and bandwidth of $F=1\ GHz$ (0.35 nsec risetime) would have equivalent input noise RMS of $Vnoise=P*sqrt(F)=32\ uV$. A typical voltage pulse amplitude observed with the fast output with 3*3 mm devices is:

$$V=K*Vbias/N$$

Where:
 $N=4774$ is number of cells
 $K=0.3$ is ratio of the Fast Terminal Signal to Total capacitance
 $Vbias=2-3V$
Therefore
 $V=0.12\ mV$
Therefore the voltage slew rate is:

$$dV/dt=V/Tau=60\ uV/nSec$$

Therefore the timing jitter arising for single photoelectron signal is:

$$DT=Vnoise/dV/dt=0.5\ nsec\ RMS$$

Such a timing figure significantly limits the timing performance of the SPM device as intrinsic avalanche jitter of the device is less than 50 psec RMS.

Figure 23:
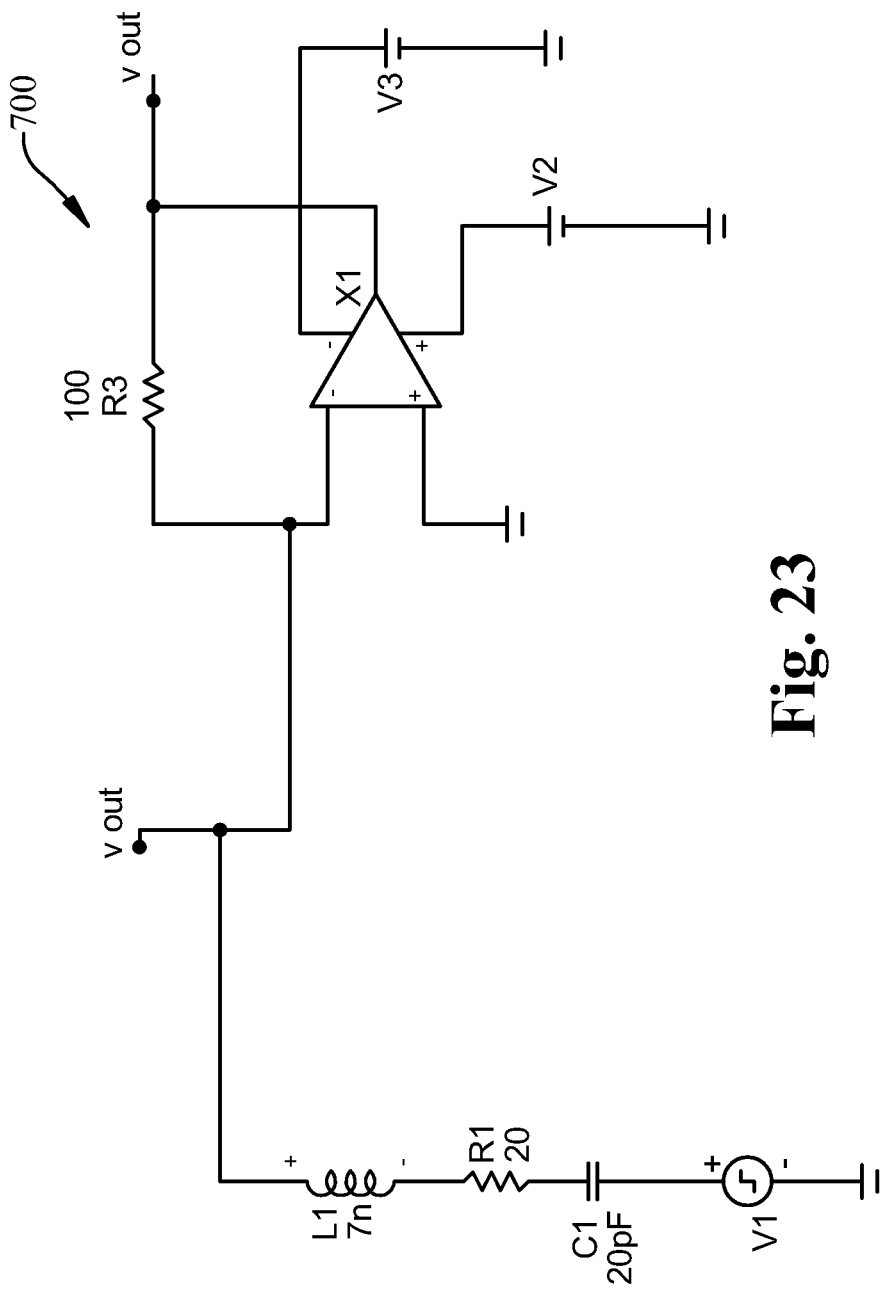
FIG. 23 is illustrates an equivalent circuit of an SPM operably coupled to a transimpedance amplifier.
Figure 24:
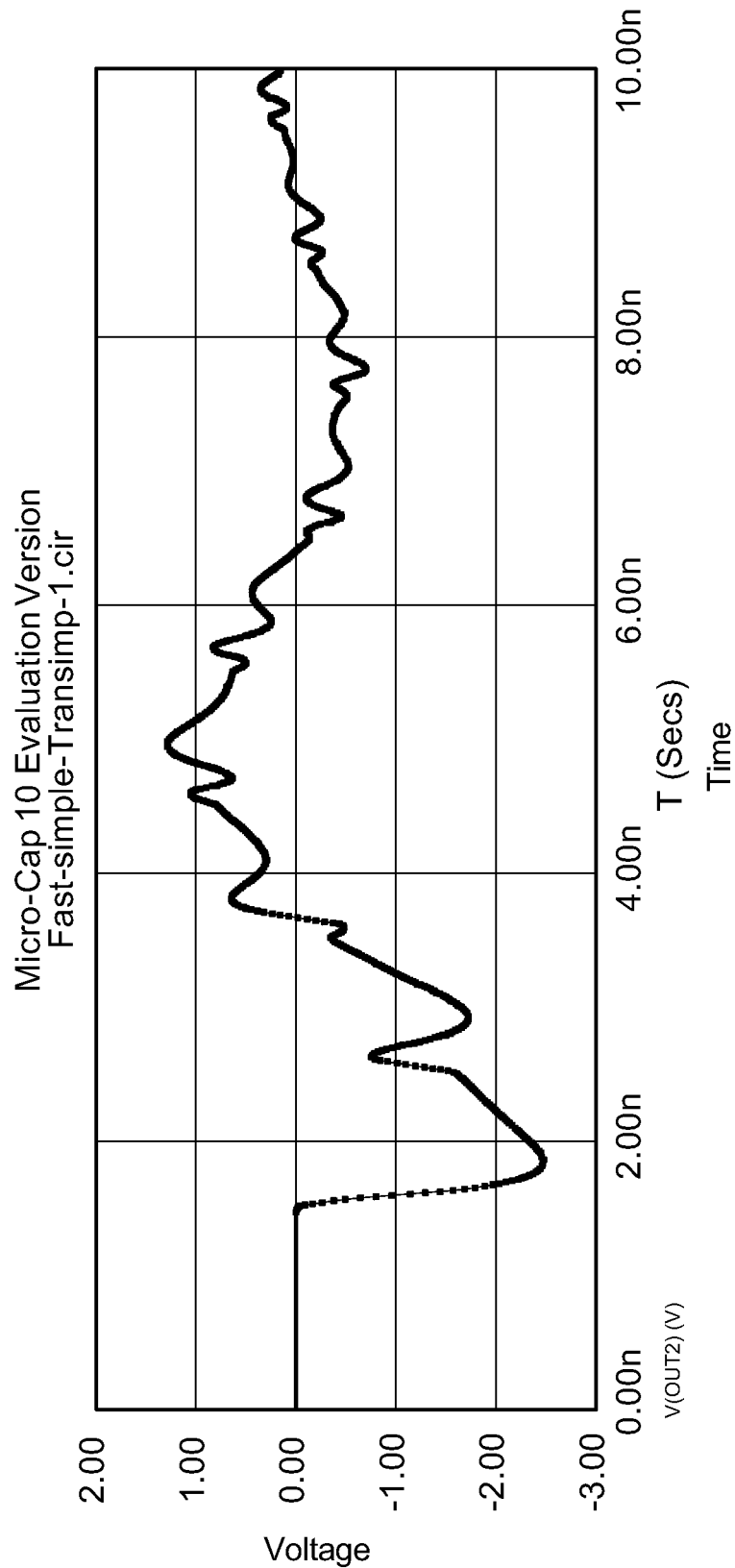
FIG. 24 is an output signal from the transimpedance amplifier of FIG. 23.

In order to improve DT, a number of parameters may be varied. For example, a smaller resistive load may be employed, e.g. r=10-15 ohm. However it will result in much lower signal amplitude (proportionally to r/R) which is not acceptable for such low signals (0.15 mV typically at 50 ohm load or so for a single photoelectron signal). The typical method to avoid this effect is to use a transimpedance amplifier 700 to read out the signal as illustrated in FIG. 23. The transimpedance amplifier preserves signal amplitude visible to the amplifier while reducing the effective of load resistance. However, with a short input signal transmission line the transimpedance amplifier 700 may become unstable due to feedback loop delay as illustrated in FIG. 24. Therefore, it is desirable to reduce the output capacitance of the readout fast electrode as it improves timing performance even if it results in some marginal loss of the signal amplitude. Thus the SPMs 400 and 500 due to their improved timing performance are particularly suitable for using with a transimpedance amplifier 700 to read out the signal from the fast electrode.

Figure 25:
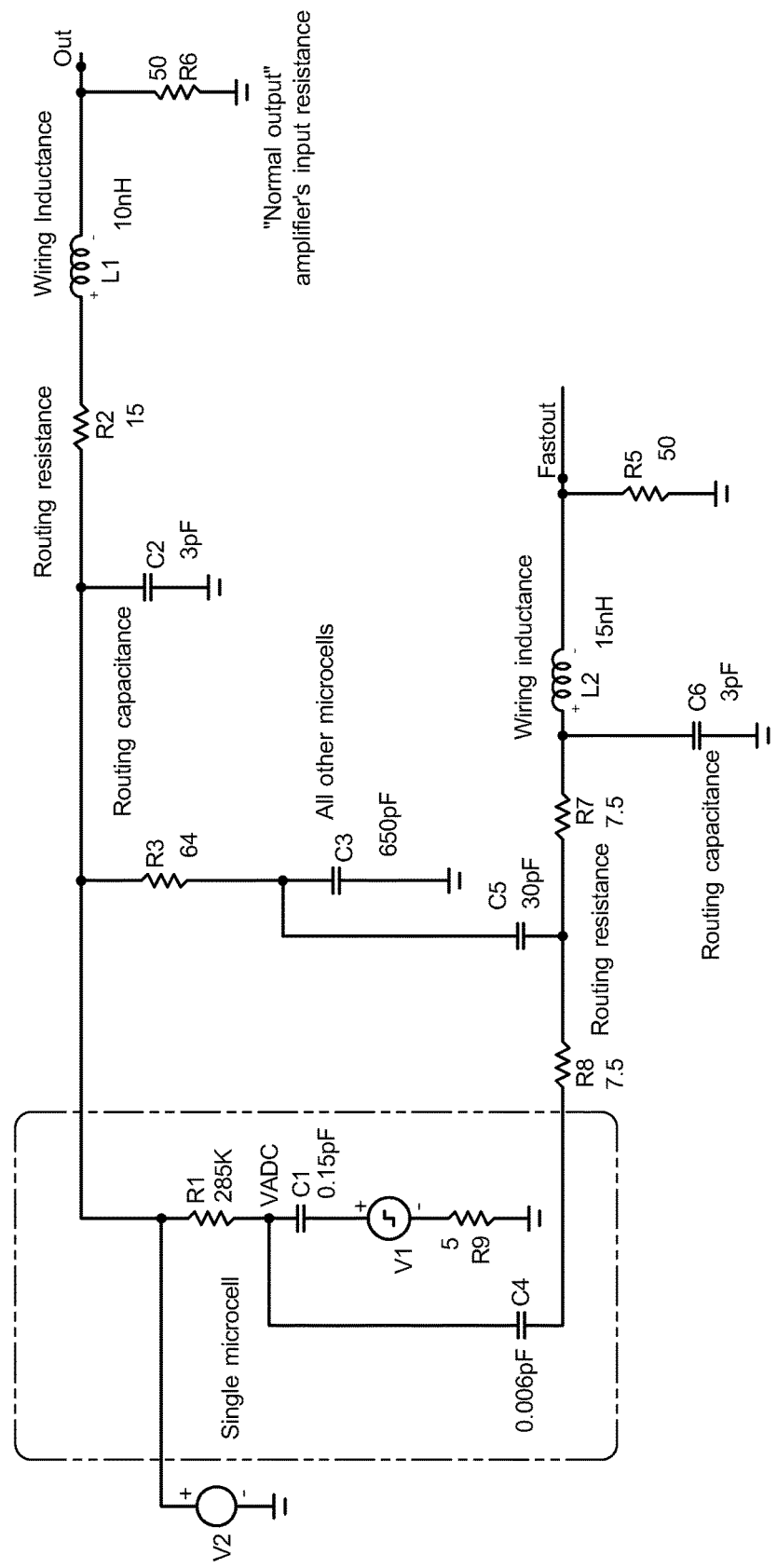
FIG. 25 is another equivalent circuit of the SPM of the FIG. 3.
Figure 26:
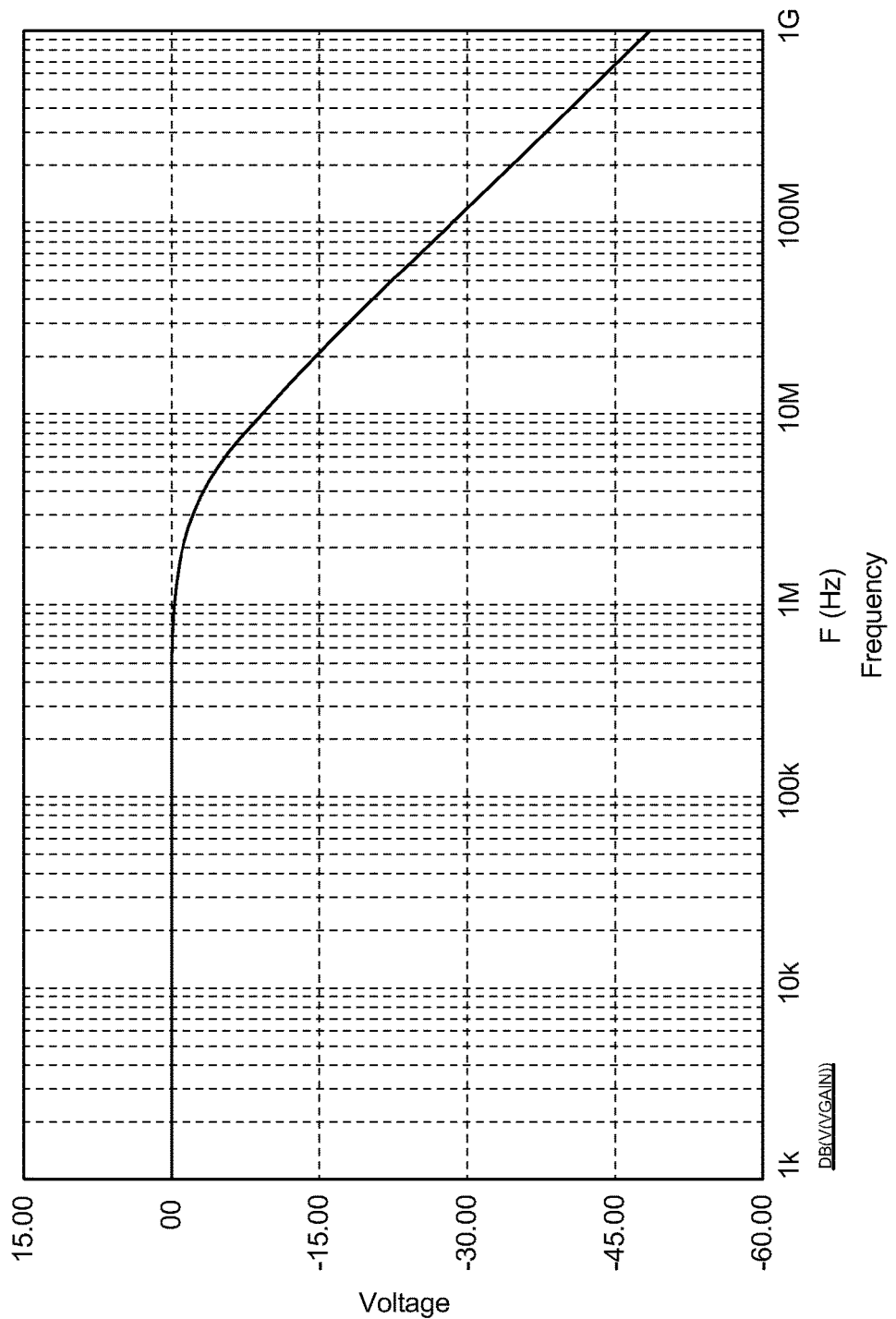
FIG. 26 is graphical representation of a voltage response of the avalanche voltage of FIG. 25.
Figure 27:
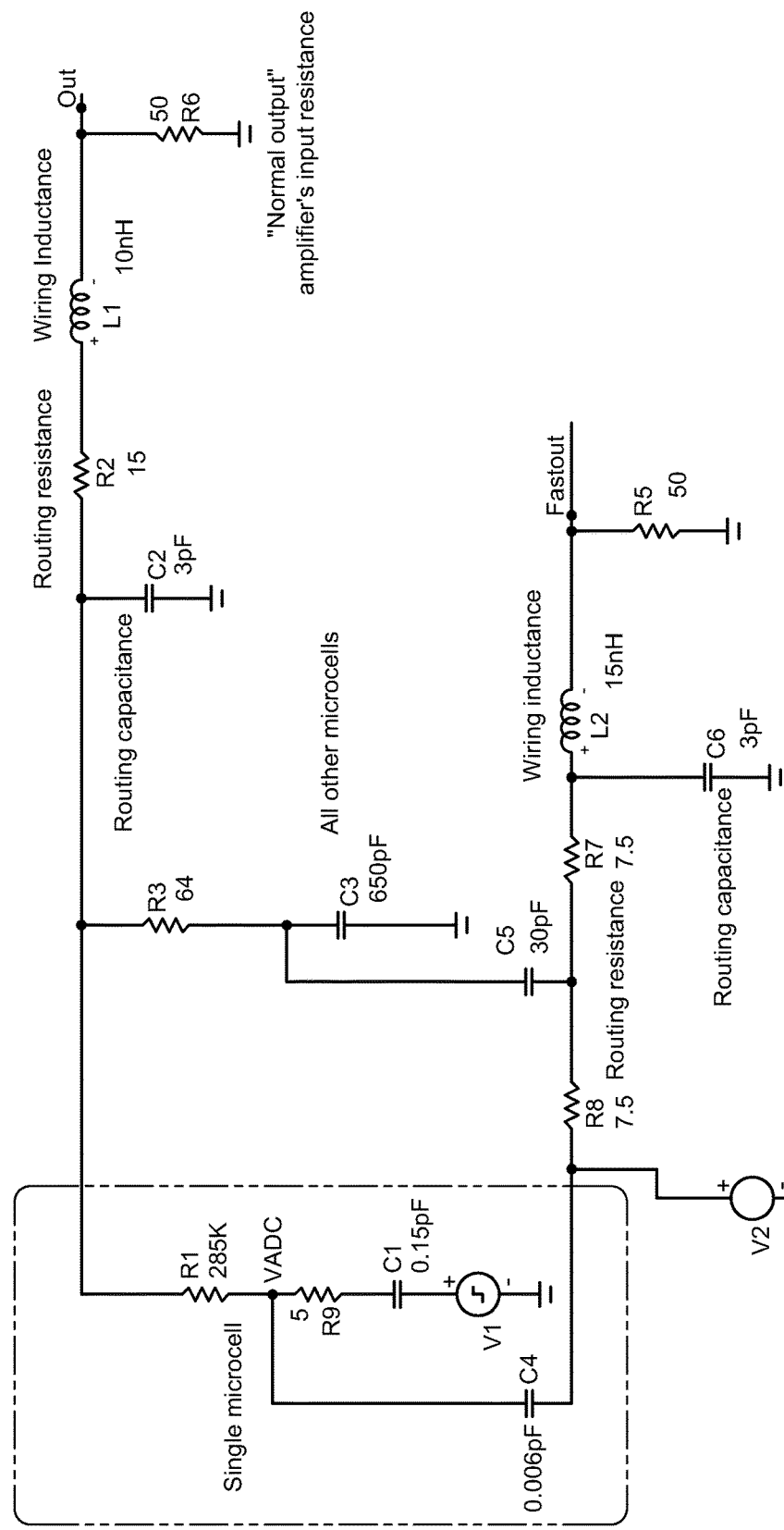
FIG. 27 is an equivalent circuit of an SPM with a frequency modulation signal applied to a fast terminal.
Figure 28:
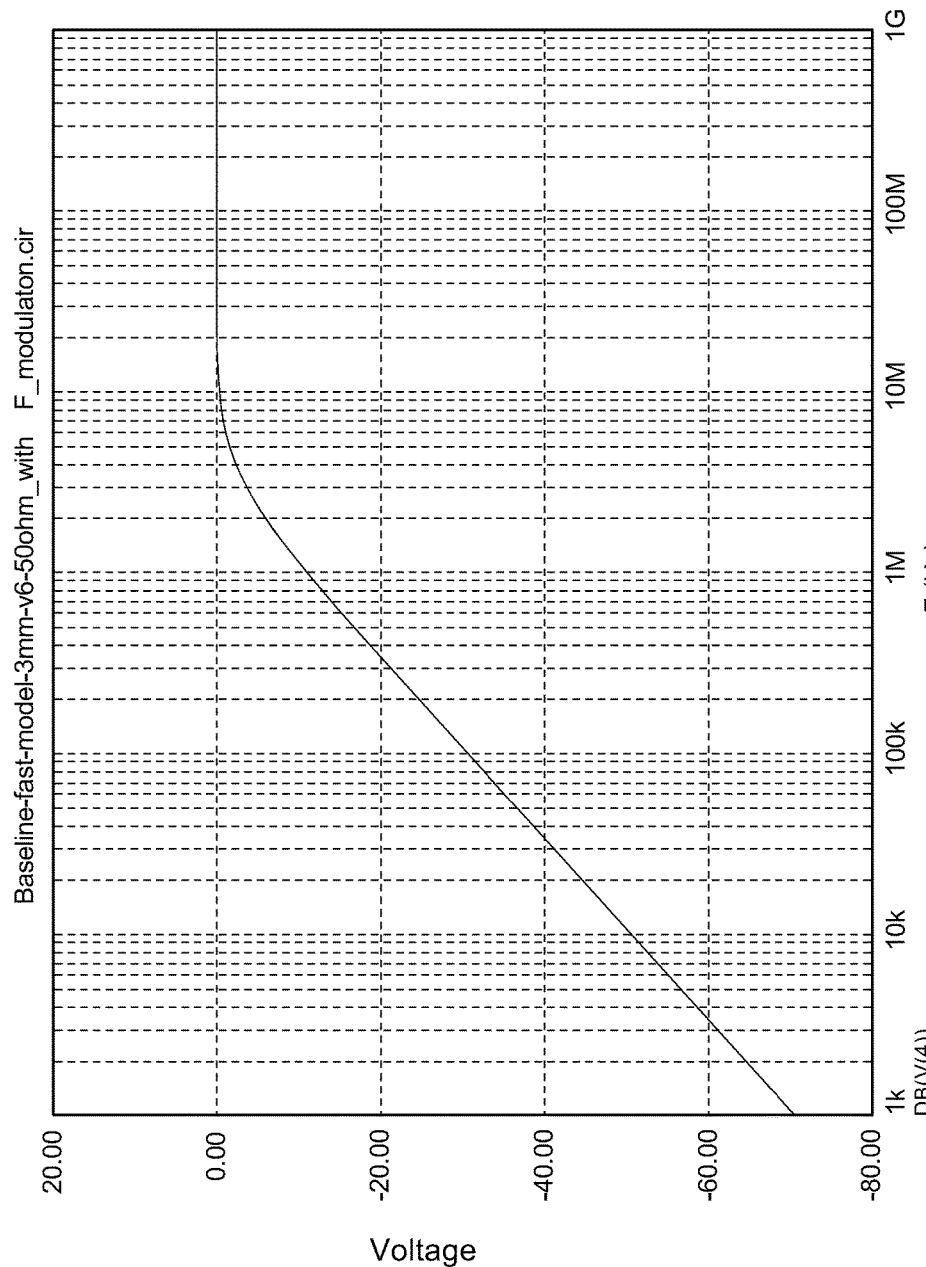
FIG. 28 is graphical representation of a voltage response of the avalanche voltage of FIG. 27.

Referring now to FIG. 25, is another equivalent circuit of the SPM 300 of FIG. 3 where the avalanche voltage of the firing photodiode is represented as a variable voltage source V1, the capacitance of the firing photodiode is represented by C1 and the resistance of the photodiode is represented by R9. The coupling capacitor 320 is represented by capacitor C4, the quench resistor is represented by resistor R1. The power terminal of the circuit of FIG. 25 may be driven at high frequency in order to achieve a frequency modulation of the avalanche signal from the photodiode—this type of modulation is known in the art. FIG. 26 shows the voltage response over the capacitor C1 which corresponds to the avalanche voltage of the photodiode. The magnitude of the avalanche signal sharply declines when the modulation frequency is greater than 1 MHz. Thus the prior art method of applying a modulation frequency signal to the power electrode limits the frequency range of the modulation frequency to approximately 1 MHz. The present inventors have realised that the effective modulation frequency may be significantly increased by applying the modulation frequency to the fast output terminal as illustrated in FIG. 27. In the exemplary arrangement, the modulation frequency may be increased to 10 MHz or greater as illustrated in FIG. 28. In an exemplary embodiment, the ratio of the output capacitance of the SPM 300 and the capacitance of the photodiode are modified to induce a gain modulation on the photodiode. In one arrangement the capacitance may be varied from 1% to 4%. Alternatively, the capacitance may be varied from 1% to 10%. In another arrangement, the capacitance is varied from 1% to 20%.

Figure 29:
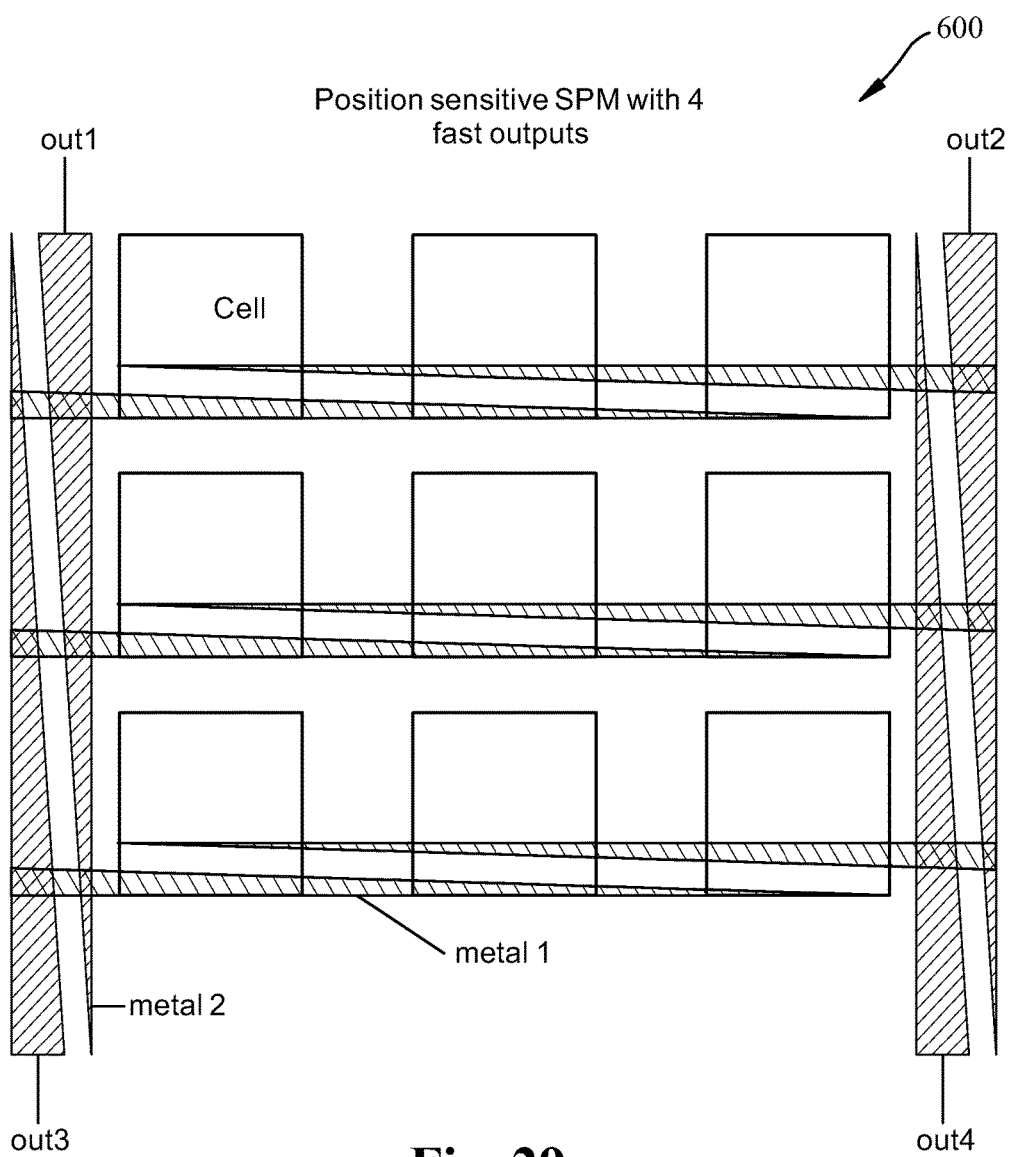
FIG. 29 illustrates an SPM configured for a position sensor application.
Figure 30:
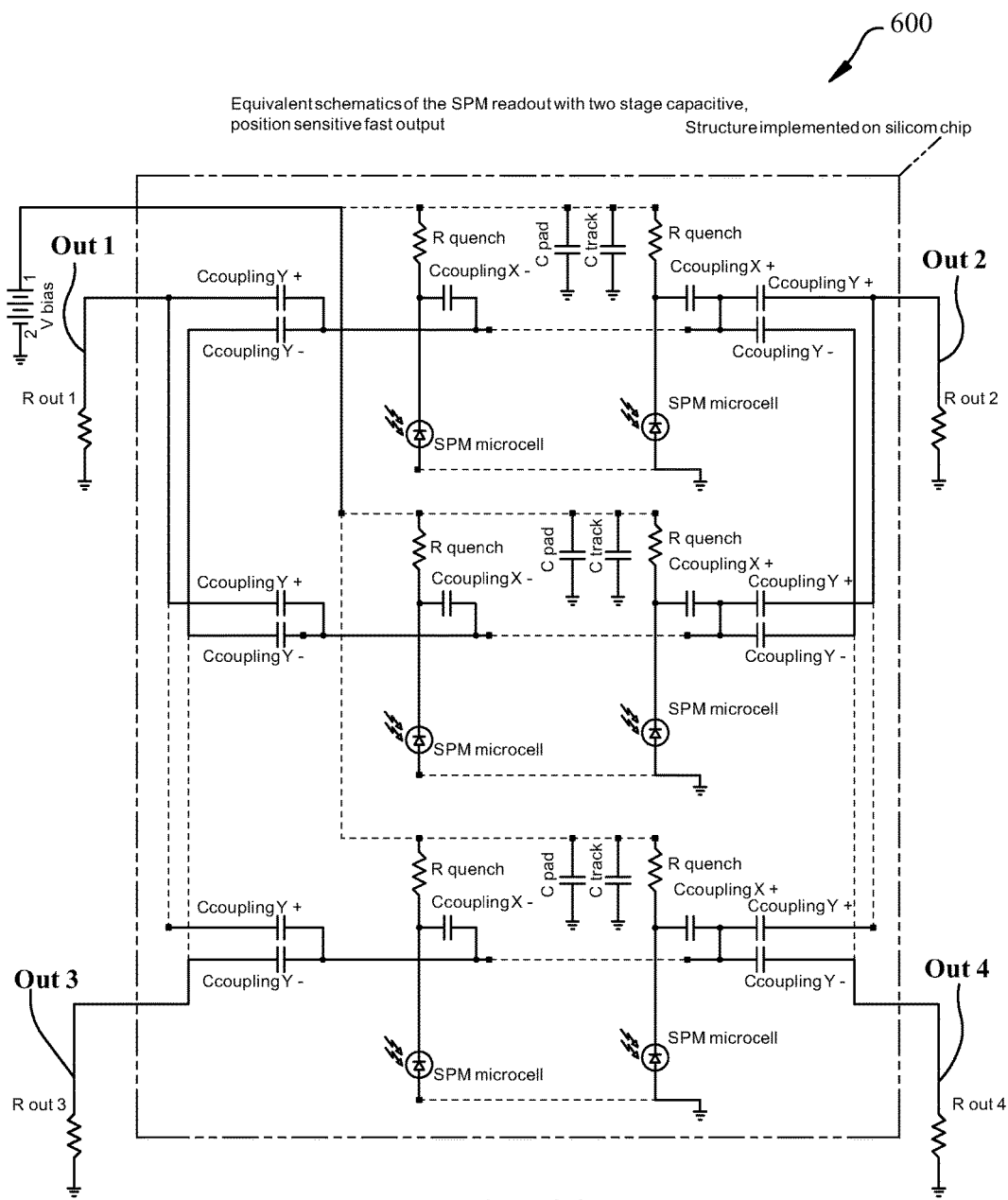
FIG. 30 is a circuit schematic representation of the SPM of FIG. 29.
Figure 31:
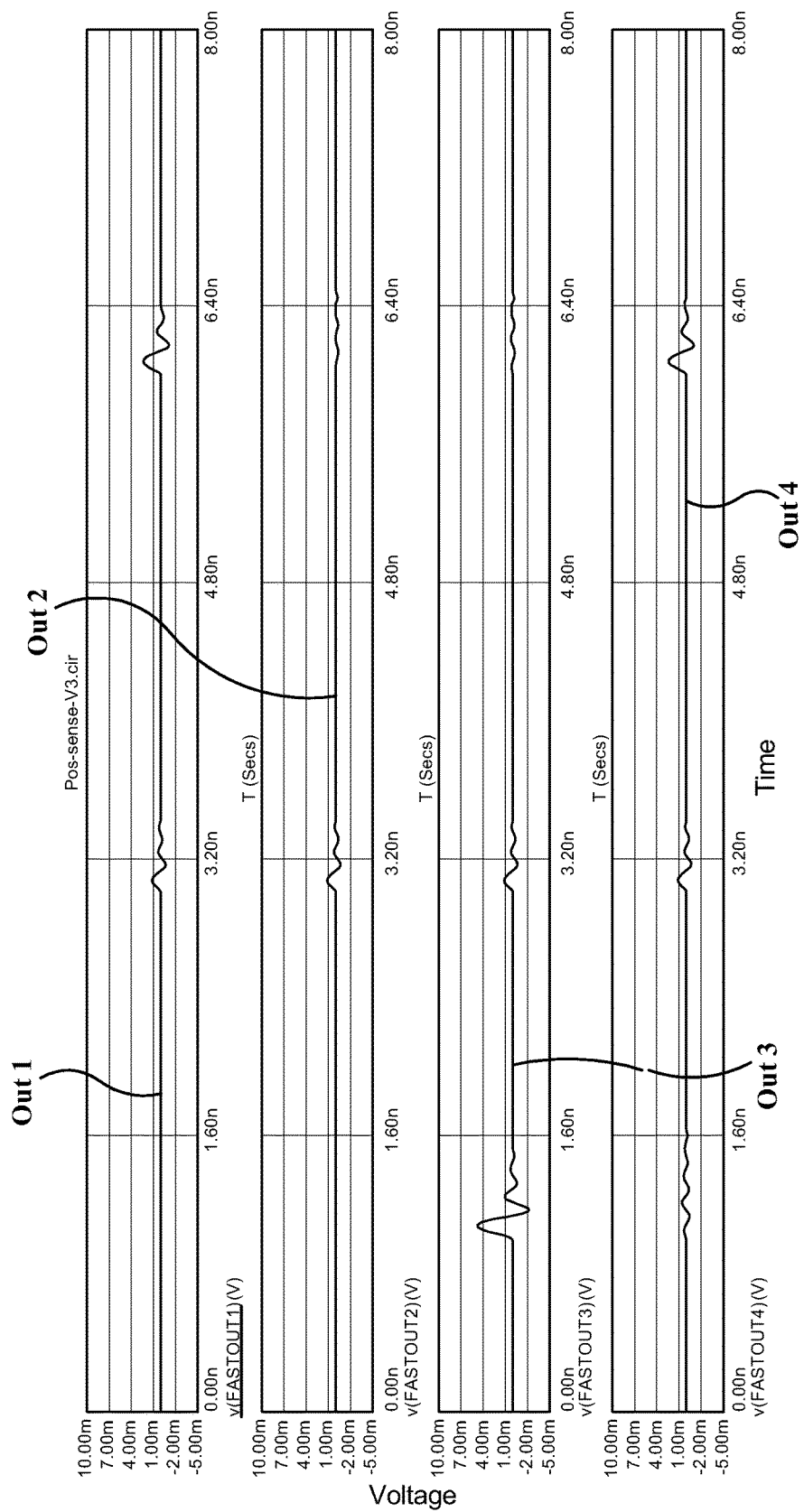
FIG. 31 is a graphical representation of simulated outputs from the circuit of FIG. 30.

Referring now to FIGS. 29 to 31, there is provided a position sensitive semiconductor photomultiplier 600 with a plurality of fast output terminals. As previously described with reference to FIG. 3 the fast readout is a technique of reading out silicon photomultiplier using capacitive coupling to the avalanche current inside each microcell. The SPM 600 includes four fast electrodes, namely, out 1, out 2, out 3 and out 4. Each of the four electrodes have different capacitive coupling weights to each microcell representing relative coordinates of the microcell. This arrangement may be implemented via two stage weighted capacitive divider similar to that described with reference FIG. 6. FIG. 30 provides a circuit schematic representation of the semiconductor photomultiplier 600. FIG. 31 provides a diagrammatic illustrations of the fast outputs, namely, out 1, out 2, out 3 and out 4. In order to provide identification of both X and Y position of the firing (active) microcell, the capacitive weighting may be implemented as follows:

$$C_{coupling}Y+_{(0)} < C_{coupling}Y+_{(1)} < \ldots < C_{coupling}Y+_{(n-1)}$$
$$< C_{coupling}Y+_{(n)}$$

$$C_{coupling}Y-_{(0)} > C_{coupling}Y-_{(1)} > \ldots > C_{coupling}Y-_{(n-1)}$$
$$> C_{coupling}Y-_{(n)}$$

$$C_{coupling}X+_{(0)} < C_{coupling}X+_{(1)} < \ldots < C_{coupling}X+_{(m-1)}$$
$$< C_{coupling}X+_{(m)}$$

$$C_{coupling}X-_{(0)} > C_{coupling}X-_{(1)} > \ldots > C_{coupling}X-_{(m-1)}$$
$$> C_{coupling}X-_{(m)}$$

In a preferred embodiment there is a linear relationship between index of the row or column (n or m) and coupling capacitance such that:

$$C_{coupling}X = C_{stepX} * m$$

$$C_{coupling}Y = C_{stepY} * n$$

It will be appreciated that the present teaching can overcome the problems and disadvantages associated with current strategies and designs and provides new materials and methods for improving photodetectors such as SPM devices.

SPMs have the potential to become a replacement for photomultiplier tubes (PMTs) and avalanche photodiode (APDs) for use as photodetectors in positron emission topography (PET), single photon emission computed tomography (SPECT), computed tomography (CT), and other radiation detectors. These devices are compact, have high gain, high quantum efficiency (about 20%-70%, which is better than that of traditional PMTs) and low noise. These devices have the potential to be used in time-of-flight PET applications due to their potential timing performance. They are also insensitive to magnetic fields, a quality which makes them ideal for use in an MR (magnetic resonance) environment.

It will be understood that what has been described herein are exemplary embodiments of circuits which have many advantages over the photon detectors known heretofore.

One advantageous aspect is directed to a silicon photomultiplier (SPM) device comprising a three electrode connection scheme where two electrodes are used for biasing of the SPM and as the signal and ground electrodes, while a third electrode is used to read out the signal, using one of the first two electrodes as signal ground. The third electrode is galvanically isolated from the first two electrodes and capacitively coupled to each Geiger-mode photosensitive cell. Preferably, the SPM device comprises an array of Geiger-mode avalanche photodiode (APD) cells wherein the array produces an output pulse proportional to an input photon pulse.

Another advantageous aspect is directed to the readout method of a three electrode SPM device, wherein the third (signal) electrode is read out using wideband (bandwidth>200 MHz) amplifier with low input impedance (<200 ohm) proving output pulses with less than 5 ns duration.

Another advantageous aspect is directed to the readout method of a three electrode SPM device, where the third (signal) electrode is read out using a charge sensitive (current integrating) amplifier providing an output proportional to the number of Geiger-mode photosensitive cells firing within some period of time of interest.

In summary, an embodiment of the present invention provides a semiconductor photomultiplier [SPM] device having a three electrode connection scheme where two electrodes are used for biasing of the SPM and as the signal ground electrode, while a third electrode is used to readout the signal using one of the first two electrodes as signal ground.

The third electrode may be galvanically isolated from the other two electrodes and capacitively coupled to each Geiger-mode photosensitive cell. The signal in the third electrode may be induced electrostatically.

In a readout method for such a SPM device, the third (signal) electrode may be read out using wideband (e.g. bandwidth>200 MHz) amplifier with low input impedance (e.g. <200 ohm) providing output pulses with less than e.g. 5 ns duration.

In a readout method for such a SPM device, the third (signal) electrode may be read out using charge sensitive (current integrating) amplifier providing an output proportional to the number of Geiger-mode photosensitive cells firing within a period of time of interest.

It will be appreciated that reference herein to a three electrode connection scheme does not preclude the possibility that the device has a fourth and possibly further electrodes provided for other purposes. It will be appreciated by the person of skill in the art that various modifications may be made to the above described embodiments without departing from the scope of the present invention. In this way it will be understood that the teaching is to be limited only insofar as is deemed necessary in the light of the appended claims. The term semiconductor photomultiplier is intended to cover any solid state photomultiplier device such as Silicon Photomultiplier [SiPM], MicroPixel Photon Counters [MPPC], MicroPixel Avalanche Photodiodes [MAPD] but not limited to.

Similarly the words comprises/comprising when used in the specification are used to specify the presence of stated features, integers, steps or components but do not preclude the presence or addition of one or more additional features, integers, steps, components or groups thereof.

We claim:

1. A semiconductor photomultiplier device comprising:
   a plurality of photosensitive cells each having a photo-detector, a quench resistive load and a first stage capacitor, each first stage capacitor being operably coupled to a node common to the photo-detector and the quench resistive load of the corresponding photosensitive cell, the device being arranged in a three electrode connection configuration comprising first and second electrodes arranged to operably provide a biasing of the device and a third electrode arranged to provide an output signal from the photosensitive cells, and
   a plurality of second stage capacitors, whereby each second stage capacitor is operably coupled to the third electrode and to a discrete group of two or more first stage capacitors,
   wherein a two-stage capacitive coupling of a plurality of the first stage capacitors and a corresponding one of the second stage capacitors decreases pulse response duration of the output signal of the third electrode by a predetermined factor when compared to an output signal from the third electrode via a single stage capacitive coupling consisting of the plurality of first stage capacitors but without a corresponding second stage capacitor.

2. The device of claim 1, wherein the first and second stage capacitors associated with a photosensitive cell define a ratio in the range of 1 to 20.

3. A device of claim 1, wherein the first and second stage capacitors associated with a photosensitive cell define a ratio in the range of 5 to 15.

4. A device of claim 1, wherein the first and second stage capacitors associated with a photosensitive cell define a ratio substantially equal to 10.

5. The device of claim 1, further comprising a coupling node common to the first stage capacitor of two or more photosensitive cells.

6. The device of claim 5, wherein the third electrode is operably coupled to the coupling node via the second stage capacitor.

7. The device of claim 1, wherein two or more photosensitive cells are operably coupled together.

8. The device of claim 1, wherein a plurality of microcells are provided on the device.

9. The device of claim 8, wherein the microcells are arranged in a matrix formation on a substrate.

10. The device of claim 1, wherein two or more of the first stage capacitors are coupled together in a parallel configuration, the parallel configuration being operably coupled in series to a respective second stage capacitor.

11. The device of claim 1, wherein each photodetector comprises an avalanche photodiode.

12. The device of claim 11, wherein the avalanche photodiode is a Geiger mode avalanche photodiode.

13. The device of claim 1, wherein the device has an associated quench time constant which is set to a value for optimising the pulse duration of an output signal from the third electrode.

14. The device of claim 13, wherein the quench time constant is modified to minimize signal distortion on a output signal from the third electrode.

15. A method of frequency modulation comprising:
providing the semiconductor photomultiplier device of claim 1, and
applying a frequency modulation signal to the third electrode for frequency modulating the output signal.

16. The method of claim 15, further comprising modifying a ratio of a output capacitance of the device and a capacitance of a photodiode in order to induce a signal gain modulation in the photodiode.

17. The method of claim 16, wherein the ratio is varied in a range from 1% to 4%.

18. The method of claim 16, wherein the ratio is varied in a range from 1% to 10%.

19. The method of claim 16, wherein the ratio is varied in a range from 1% to 20%.

20. A structure comprising:
a semiconductor photomultiplier device having a plurality of photosensitive cells each having a photodiode, a quench resistive load and a first stage capacitor, each first stage capacitor is operably coupled to a node common to the photodiode and the quench resistive load of the corresponding photosensitive cell, the device being arranged in a three electrode connection configuration comprising first and second electrodes arranged to operably provide a biasing of the device and a third electrode arranged to provide an output signal from the photosensitive cells, and a plurality of second stage capacitors, whereby each second stage capacitor is operably coupled to the third electrode and to a discrete group of two or more first stage capacitors, wherein a two-stage capacitive coupling of a plurality of the first stage capacitors and a corresponding one of the second stage capacitors decreases pulse response duration of the output signal of the corresponding third electrode by a predetermined factor when compared to an output signal from the third electrode via a single stage capacitive coupling consisting of the plurality of first stage capacitors but without a corresponding second stage capacitor, and
at least two output contacts electrically coupled to the third electrode.

21. The structure of claim 20, wherein the respective output contacts are located spaced apart from each other.

22. The structure of claim 20, wherein the respective output contacts are located at diametrically opposing locations on the structure.

23. The structure of claim 20, wherein the structure defines a polygonal footprint having diametrically opposing corners.

24. The structure of claim 23, wherein the respective output contacts are located adjacent diametrically opposing corners of the footprint.

25. The structure of claim 20, wherein each output contact is connected to a corresponding bus.

26. The structure of claim 25, wherein the buses are electrically coupled together externally of the structure.

27. The structure of claim 20, wherein the length from each microcell to an associated output contact is substantially equal.

28. The structure of claim 20, further comprising a pair of biasing contacts electrically coupled to the first and second electrodes; respectively.

29. The structure of claim 20, further comprising a pair of ground contacts electrically coupled to the second electrode.

30. The structure of claim 20, wherein the resistive load includes a first quench resistive load, and
a second quench resistive load, and wherein the third electrode is configured in a daisy chain configuration operably coupling the plurality of photosensitive cells together.

31. The structure of claim 30, wherein the photodiode is operably coupled between the first and second quench resistive loads such that an anode of the photodiode is associated with the first quench resistor and the cathode of the photodiode is associated with the second quench resistor.

32. The structure of claim 30, wherein the output electrode electrically couples the anode of a photodiode of a first photosensitive cell with the cathode of a photodiode of a second photosensitive cell.

33. A method of fabricating a semiconductor device, the method comprising:
providing a plurality of photosensitive cells on a substrate, each photosensitive cell having a photodiode, a quench resistive load and a first stage capacitor, each first stage capacitor is operably coupled to a node common to the photodiode and the quench resistive load of the corresponding photosensitive cell,
providing a three electrode connection configuration comprising first and second electrodes arranged to operably provide a biasing of the device and a third electrode arranged to provide an output signal from the photosensitive cells, and
providing a plurality of second stage capacitors, whereby each second stage capacitor is operably coupled to the third electrode and to a discrete group of two or more first stage capacitors, wherein a two-stage capacitive coupling of a plurality of the first stage capacitors and a corresponding one of the second stage capacitors decreases pulse response duration of the output signal of the corresponding third electrode by a predetermined factor when compared to an output signal from the third electrode via a single stage capacitive coupling consisting of the plurality of first stage capacitors but without a corresponding second stage capacitor.

34. A semiconductor device comprising:

a plurality of photosensitive cells each having a photo-detector, a quench resistive load and a first stage capacitor, each first stage capacitor is operably coupled to a node common to the photo-detector and the quench resistive load of the corresponding photosensitive cell, the device being arranged in a three electrode connection configuration comprising first and second electrodes arranged to operably provide a biasing of the device and a third electrode arranged to provide an output signal from the photosensitive cells, and a plurality of second stage capacitors, whereby each second stage capacitor is operably coupled to the third electrode and to a discrete group of two or more first stage capacitors, wherein a two-stage capacitive coupling of a plurality of the first stage capacitors and a corresponding one of the second stage capacitors decreases pulse response duration of the output signal of the corresponding third electrode by a predetermined factor when compared to an output signal from the third electrode via a single stage capacitive coupling consisting of the plurality of first stage capacitors but without a corresponding second stage capacitor; and a plurality of output electrodes each associated with a weighted capacitive load.

35. The device of claim 34, wherein four output electrodes are provided.

36. The device of claim 34, wherein each output electrode has a different capacitive coupling weight.

37. A position sensor comprising the semiconductor device of claim 34.

38. The sensor of claim 37, wherein the capacitive weights are representative of relative coordinates of the photosensitive cells.

* * * * *